United States Patent
Liang et al.

(10) Patent No.: US 11,348,786 B2
(45) Date of Patent: May 31, 2022

(54) RUBBING-INDUCED SITE-SELECTIVE GROWTH OF DEVICE PATTERNS

(71) Applicant: THE REGENTS OF THE UNIVERSITY OF MICHIGAN, Ann Arbor, MI (US)

(72) Inventors: Xiaogan Liang, Ann Arbor, MI (US); Byunghoon Ryu, Ann Arbor, MI (US)

(73) Assignee: THE REGENTS OF THE UNIVERSITY OF MICHIGAN, Ann Arbor, MI (US)

(*) Notice: Subject to any disclaimer, the term of this patent is extended or adjusted under 35 U.S.C. 154(b) by 387 days.

(21) Appl. No.: 16/696,038

(22) Filed: Nov. 26, 2019

(65) Prior Publication Data

US 2020/0176250 A1 Jun. 4, 2020

Related U.S. Application Data

(60) Provisional application No. 62/774,947, filed on Dec. 4, 2018.

(51) Int. Cl.
*H01L 21/02* (2006.01)
*H01L 21/285* (2006.01)
(Continued)

(52) U.S. Cl.
CPC .. *H01L 21/02568* (2013.01); *H01L 21/02013* (2013.01); *H01L 21/28568* (2013.01);
(Continued)

(58) Field of Classification Search
CPC ......... H01L 21/02568; H01L 21/02013; H01L 21/28568; H01L 29/78684; H01L 45/1666;
(Continued)

(56) References Cited

U.S. PATENT DOCUMENTS 10,056,498 B2 8/2018 Yeh et al.
10,752,794 B2* 8/2020 Kuljanishvili .......... C23C 16/30
(Continued)

FOREIGN PATENT DOCUMENTS

CN 105021683 A 11/2015
KR 101567579 B1 11/2015

OTHER PUBLICATIONS

Gang Hee Hang, et al., Seeded Growth of Highly Crystalline Molybdenum Disulphide Monolayers at Controlled Locations, Nature Communications, Jan. 28, 2015, vol. 6.
(Continued)

*Primary Examiner* — David Vu
*Assistant Examiner* — Brandon C Fox
(74) *Attorney, Agent, or Firm* — Harness, Dickey & Pierce, P.L.C.

(57) ABSTRACT

The superior electronic and mechanical properties of 2D-layered transition metal dichalcogenides and other 2D layered materials could be exploited to make a broad range of devices with attractive functionalities. However, the nanofabrication of such layered-material-based devices still needs resist-based lithography and plasma etching processes for patterning layered materials into functional device features. Such patterning processes lead to unavoidable contaminations, to which the transport characteristics of atomically-thin layered materials are very sensitive. More seriously, such lithography-introduced contaminants cannot be safely eliminated by conventional material wafer cleaning approaches. This disclosure introduces a rubbing-induced site-selective growth method capable of directly generating few-layer molybdenum disulfide device patterns without the need of any additional patterning processes. This method consists of two critical steps: (i) a damage-free mechanical rubbing process for generating microscale tri-
(Continued)

boelectric charge patterns on a dielectric surface, and (ii) site-selective deposition of molybdenum disulfide or the like within rubbing-induced charge patterns.

16 Claims, 21 Drawing Sheets

(51) Int. Cl.
    *H01L 29/786* (2006.01)
    *H02N 1/04* (2006.01)
    *B82Y 40/00* (2011.01)
    *B82Y 30/00* (2011.01)

(52) U.S. Cl.
    CPC ......... *H01L 29/78684* (2013.01); *H02N 1/04* (2013.01); *B82Y 30/00* (2013.01); *B82Y 40/00* (2013.01)

(58) Field of Classification Search
    CPC .......... H02N 1/04; B82Y 30/00; B82Y 40/00; B81C 1/00373
    USPC ........................................................ 438/667
    See application file for complete search history.

(56) References Cited

U.S. PATENT DOCUMENTS

| | | | |
|---|---|---|---|
| 2014/0251204 A1* | 9/2014 | Najmaei | C30B 25/00 117/95 |
| 2015/0064471 A1* | 3/2015 | Dresselhaus | C23C 16/0272 428/408 |
| 2017/0175258 A1* | 6/2017 | Robinson | C23C 16/305 |
| 2020/0098564 A1* | 3/2020 | Li | H01L 21/823412 |

OTHER PUBLICATIONS

Dezheng Sun, et al., Chemical Vapor Deposition Growth of a Periodic Array of Single-Layer MoS2 Islands Via Lithographic Patterning of an SiO2/Si Substrate, 2D Matters, Dec. 16, 2015, vol. 2.

Xiang Chen, et al., Lithography-Free Plasma-Induced Patterned Grown of MoS2 and its Heterojunction with Graphene, Nanoscale, Jun. 5, 2016, vol. 8.

* cited by examiner

RUBBING-INDUCED SITE-SELECTIVE GROWTH OF DEVICE PATTERNS

CROSS-REFERENCE TO RELATED APPLICATIONS

This application claims the benefit of U.S. Provisional Application No. 62/774,947, filed on Dec. 4, 2018. The entire disclosure of the above application is incorporated herein by reference.

GOVERNMENT CLAUSE

This invention was made with government support under CMMI-1636132 and ECCS-1708706 awarded by the National Science Foundation. The government has certain rights in the invention.

FIELD

The present disclosure relates to rubbing-induced site-selective ("RISS") device patterns.

BACKGROUND

Low-dimensional or atomically-thin layered nanomaterials, including two-dimensional layered transition-metal dichalcogenides, are used in a variety of electronic and optoelectronic devices. Commercially viable devices and systems including such low-dimensional nanomaterials are commonly manufactured using conventional resist-based lithography and/or plasma-based etching processes that pattern the low-dimensional nanomaterials into orderly arranged device patterns. However, such conventional patterning processes may introduce a broad range of contaminants that can modify and degrade the transport characteristics of the electronic devices. This is especially problematic in instances of low-dimensional nanomaterials comprising atomically thin structures that are hypersensitive to such contaminates. For example, device patterns made using such conventional patterning processes may have inconsistent and undesirable electronic properties throughout the patterned material. Industry-standard semiconductor cleaning processes—such as, RCA and piranha methods—used in many instances to eliminate undesirable contaminates can cause detrimental chemical and/or damage to the atomically-thin structures of the low-dimensional nanomaterials, such as delamination. Accordingly, it would be desirable to develop patterning processes for low-dimensional nanomaterials having reduced or mitigated risks of contamination and improved consistency within the patterned devices, including improved uniformity in electronic properties over large areas of the patterned material.

This section provides background information related to the present disclosure which is not necessarily prior art.

SUMMARY

This section provides a general summary of the disclosure, and is not a comprehensive disclosure of its full scope or all of its features.

A site-selective growth method is presented for fabricating a functional device. The method include: rubbing an exposed surface of a substrate with a patterned template to generate a pattern of surface charge on the exposed surface of the substrate, where triboelectric property of material comprising the substrate differs from the triboelectric property of material comprising the patterned template; and selectively depositing a two-dimensional material onto the exposed surface of the substrate such that the two-dimensional material adheres to the exposed surface in accordance with the pattern of surface charge.

The exposed surface of the substrate is preferably rubbed with a contact force or stress less than compressive strength of the material comprising the substrate.

In some embodiments, the two-dimensional material is selected from a group consisting of graphene and transition-metal dichalcogenides.

The two-dimensional material may be selectively deposited onto the exposed surface of the substrate using chemical vapor deposition or physical vapor deposition.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 4A:
FIG. 4A is a Kelvin probe force microscopy image of a patterned (rubbed) substrate formed using a copper rod at a contact force of about 29.4 mN.
Figure 4A:
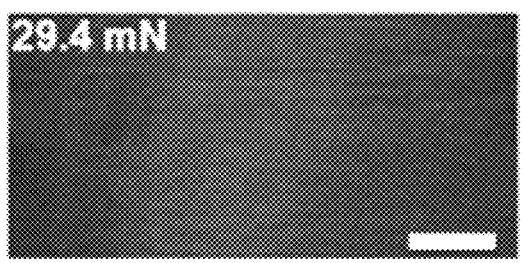
Figure 4B:
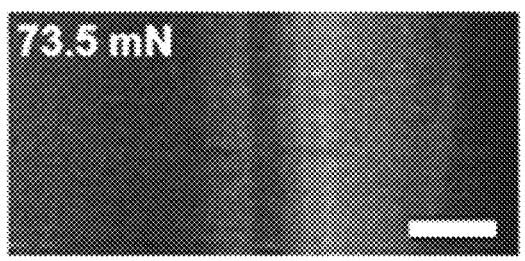
FIG. 4B is a Kelvin probe force microscopy image of a patterned (rubbed) substrate formed using a copper rod at a contact force of about 73.5 mN
Figure 4C:
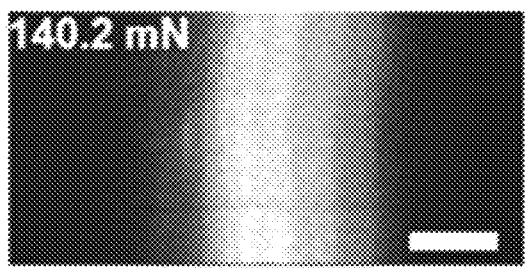
FIG. 4C is a Kelvin probe force microscopy image of a patterned (rubbed) substrate formed using a copper rod at a contact force of about 140.2 mN.
Figure 4D:
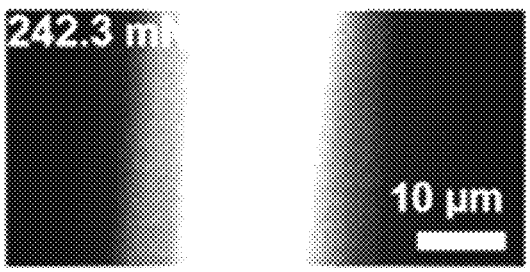
FIG. 4D is a Kelvin probe force microscopy image of a patterned (rubbed) substrate formed using a copper rod at a contact force of about 242.3 mN.
Figure 4E:
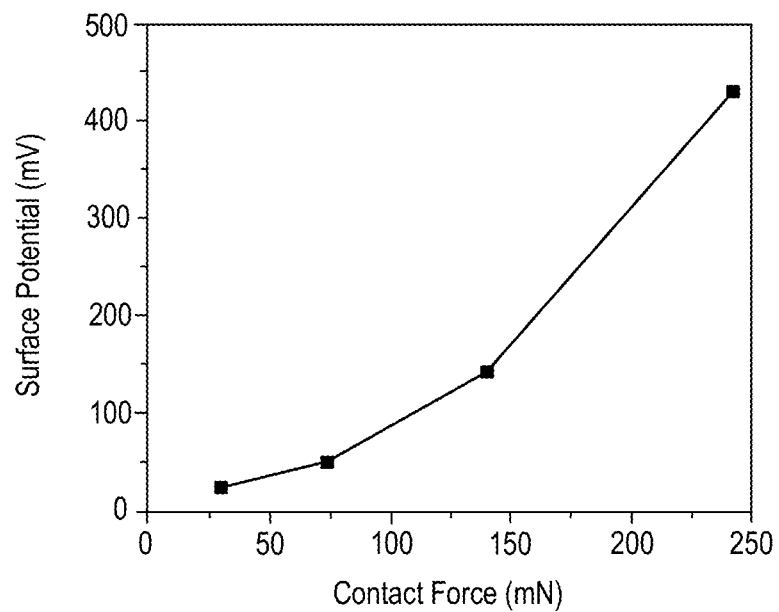
FIG. 4E is a plot of surface potentials as a function of contact forces.
Figure 4F:
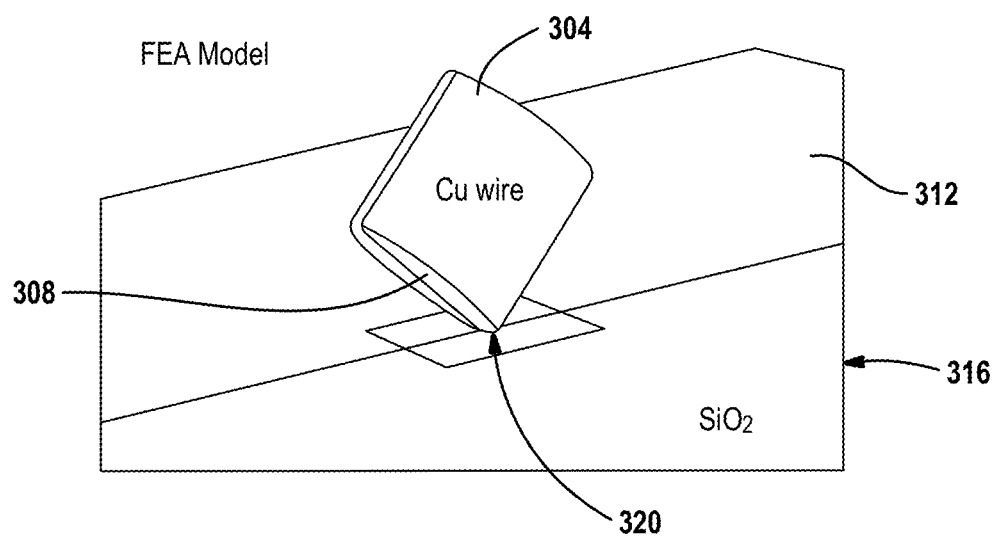
Figure 4G:
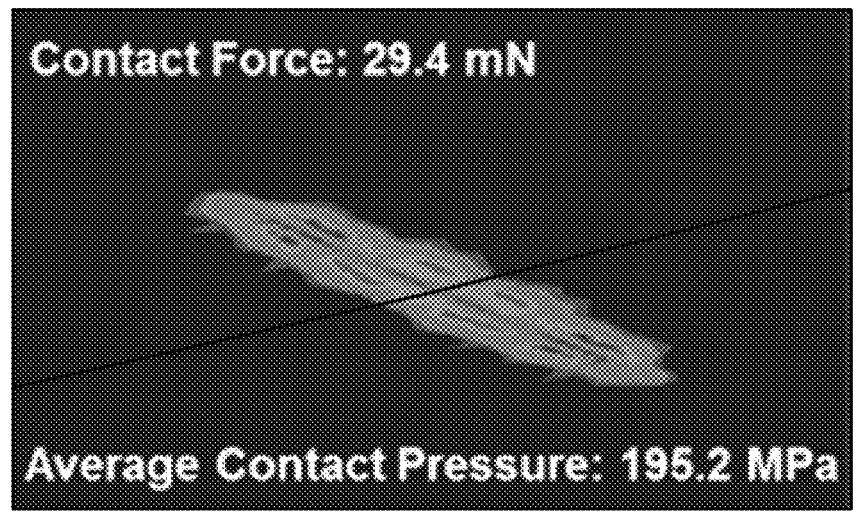
Figure 4H:
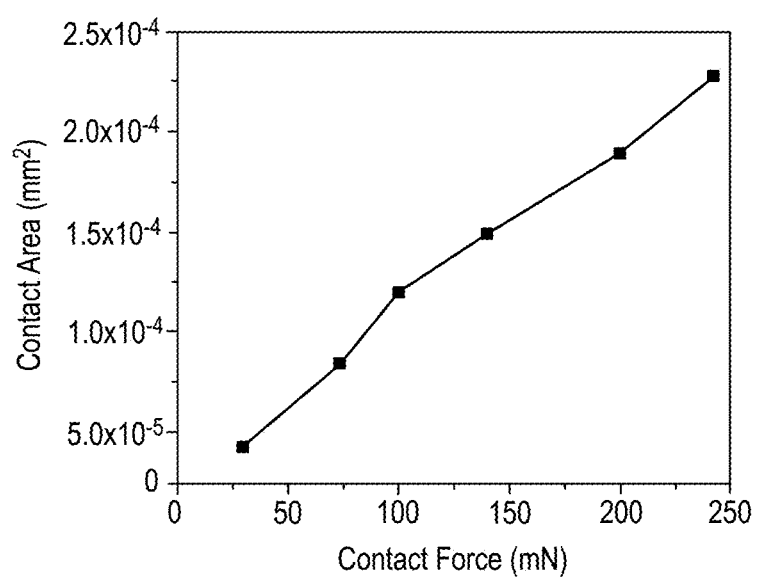

FIG. 4F is a finite element analysis model stimulating contact between the copper-coated rubbed template and the substrate FIG. 4G illustrates the distribution of the gauge pressure at the interface rubbed template, substrate interface as calculated using the finite element analysis under a contact force of 29.4 mN FIG. 4H is a plot of the contact areas, as calculated using the finite element analysis, as a function of the contact force.

Figure 4I:
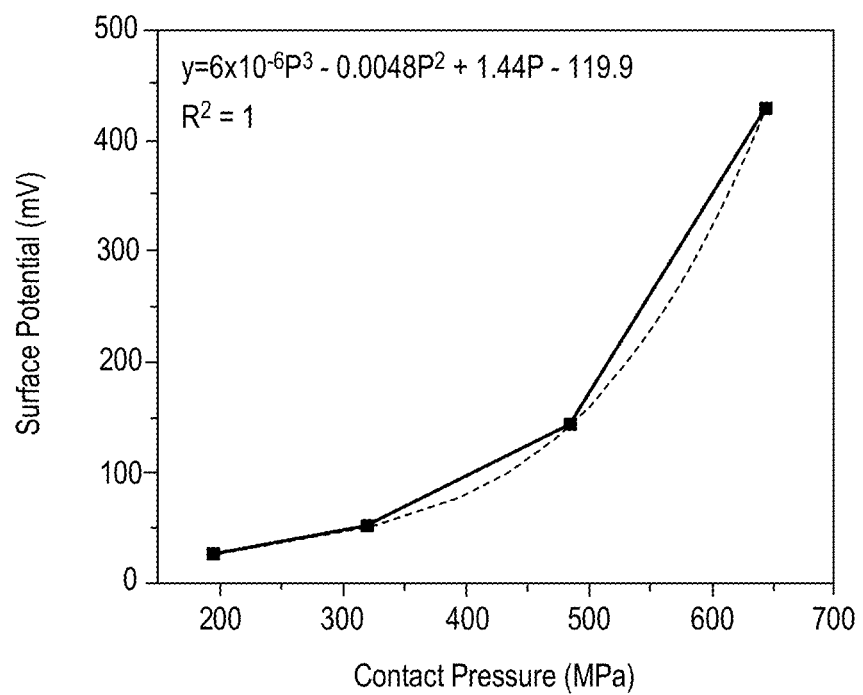

FIG. 4I is a plot of the surface potentials as a function of corresponding contact pressures, as calculated using the finite element analysis.

Figure 5A:
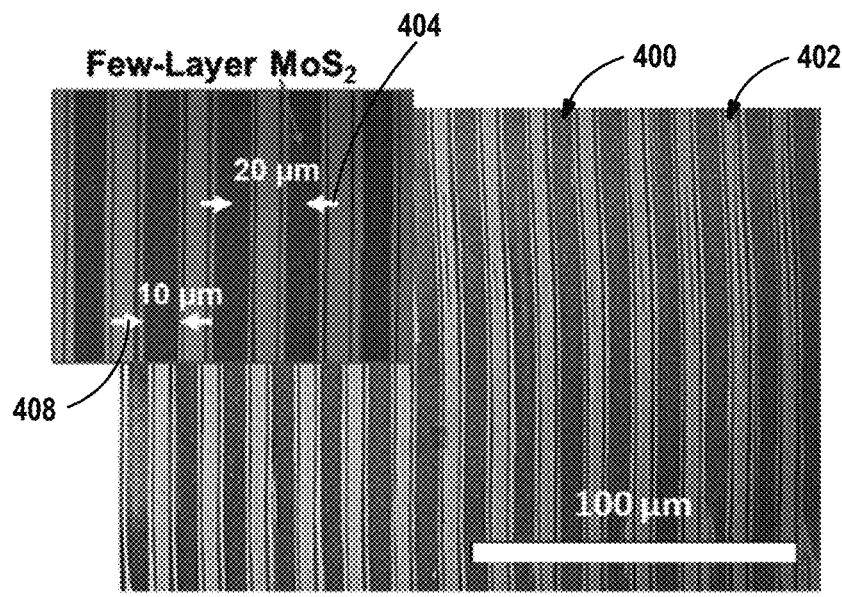

FIG. 5A is an image of a pattern having a period of about 20 μm and a linewidth of about 10 μm.

Figure 5B:
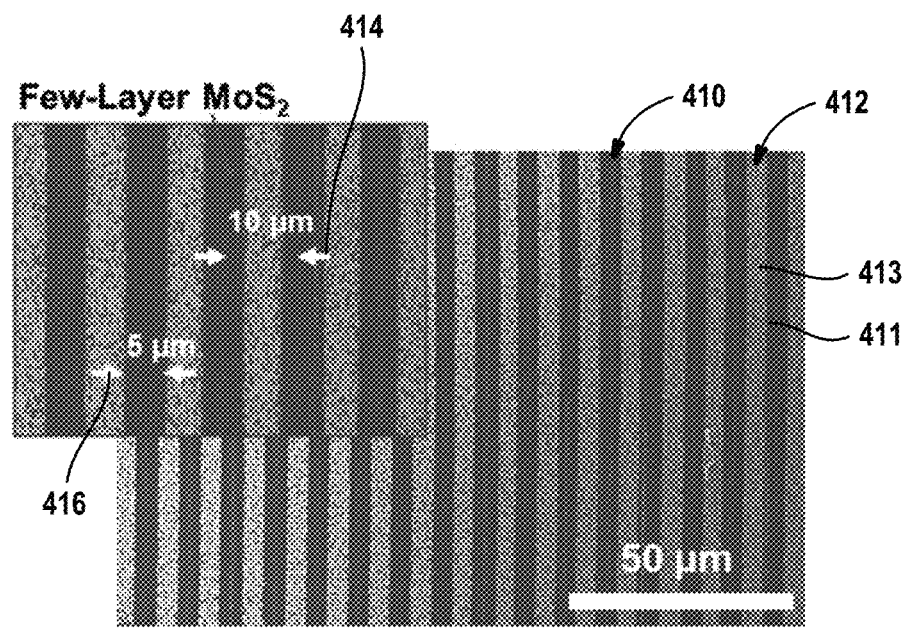

FIG. 5B is an image of a pattern having a period of about 10 μm and a linewidth of about 5 μm.

Figure 5C:
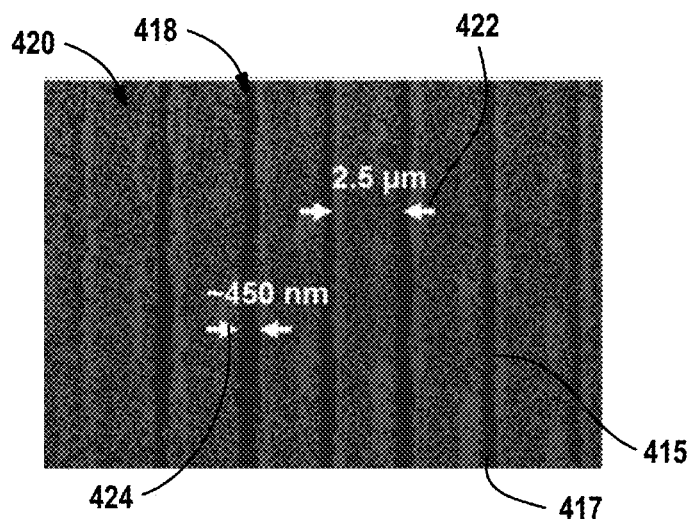

FIG. 5C is an image of a pattern having a period of about 2.5 μm and a linewidth of about 450 nm.

Figure 5D:
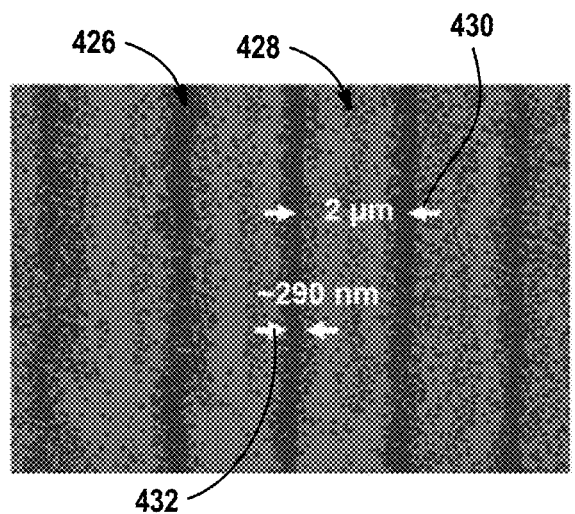

FIG. 5D is an image of a pattern having a period of about 2 μm and a linewidth of about 290 nm.

Figure 5E:
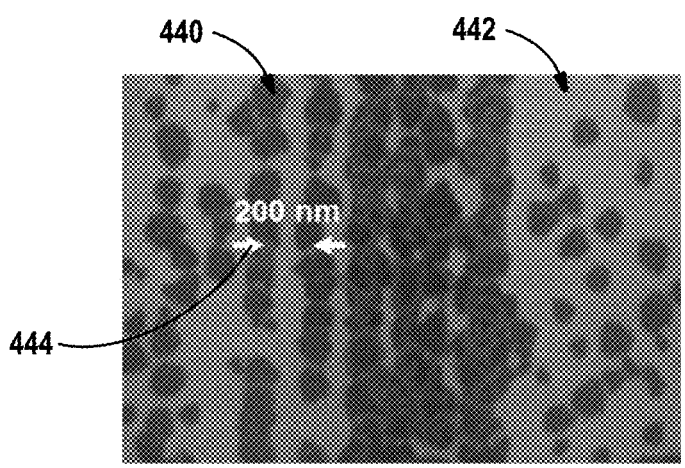

FIG. 5E is an image of a pattern having a period of about 250 nm and a non-applicable linewidth.

Figure 6A:
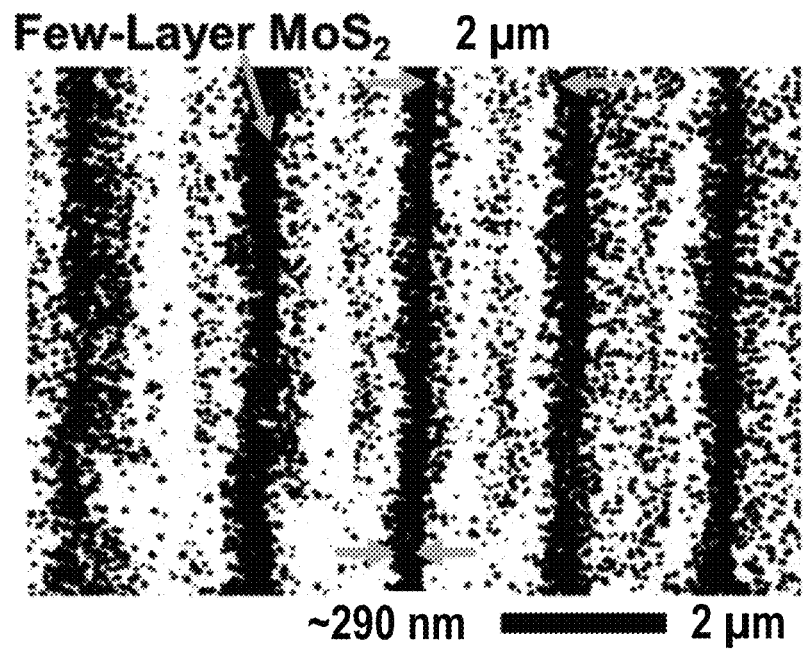

FIG. 6A is a binary image of the scanning electron micrograph image of FIG. 5D.

Figure 6B:
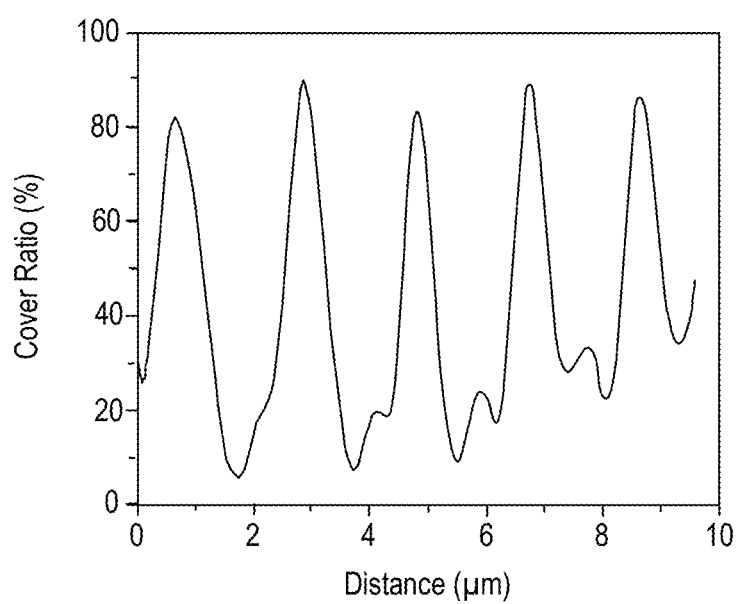

FIG. 6B is a cover ratio profile across the transition-metal dichalcogenide pattern, as extracted from FIG. 6A.

Figure 6C:
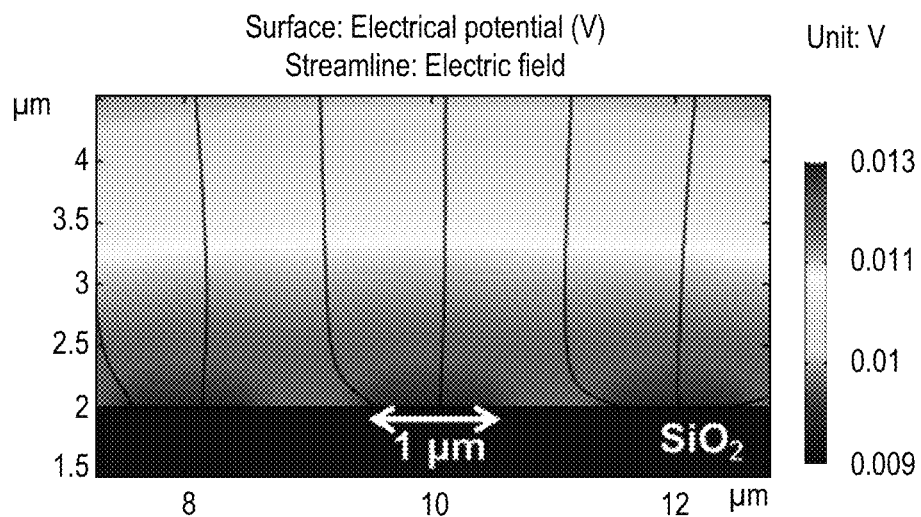

FIG. 6C is a finite element analysis stimulated electric field associated with the corresponding rubbing-induced triboelectric charge pattern.

Figure 6D:
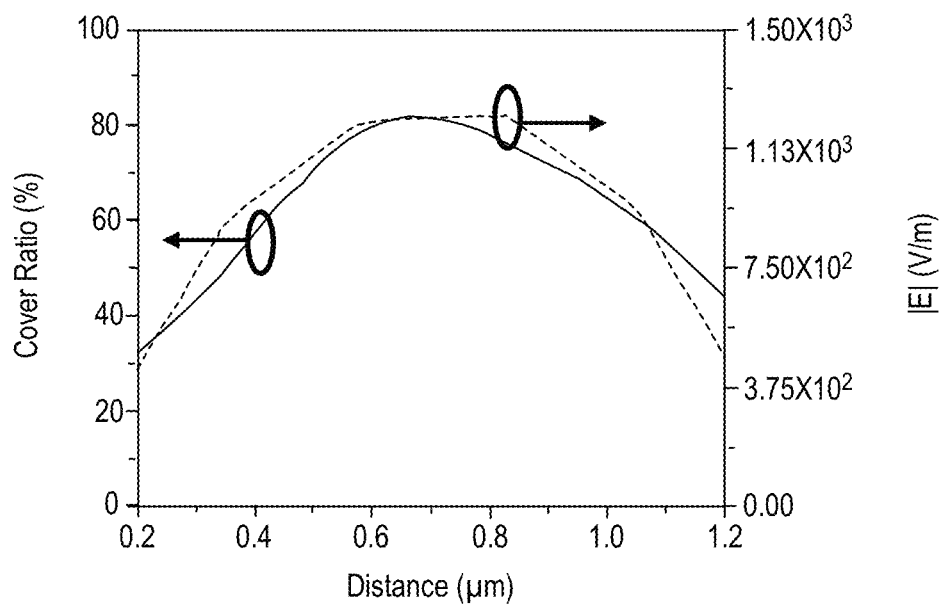

FIG. 6D is a plot if the field magnitude profile from FIG. 6C and the cover ratio profile from FIG. 6A.

Figure 7A:
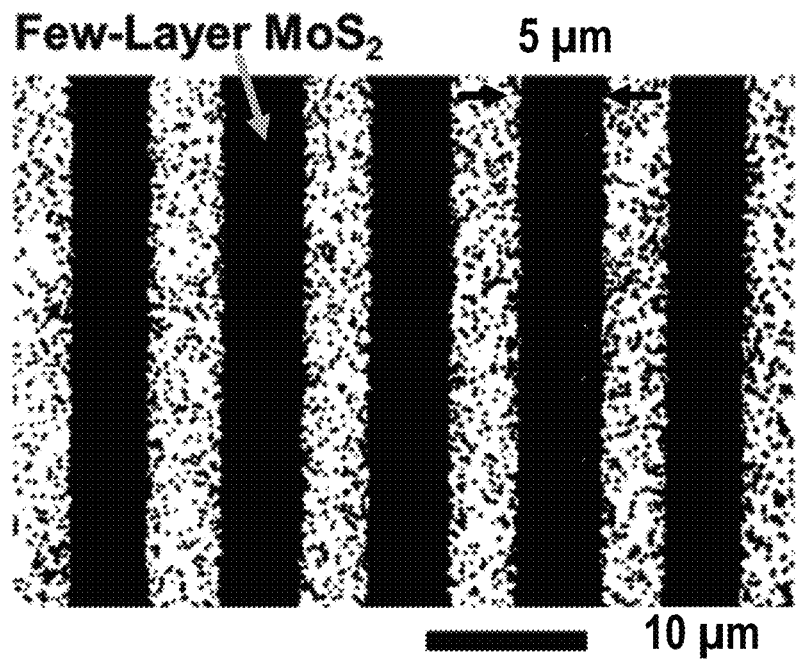

FIG. 7A is a binary image of the scanning electron micrograph image of FIG. 5B.

Figure 7B:
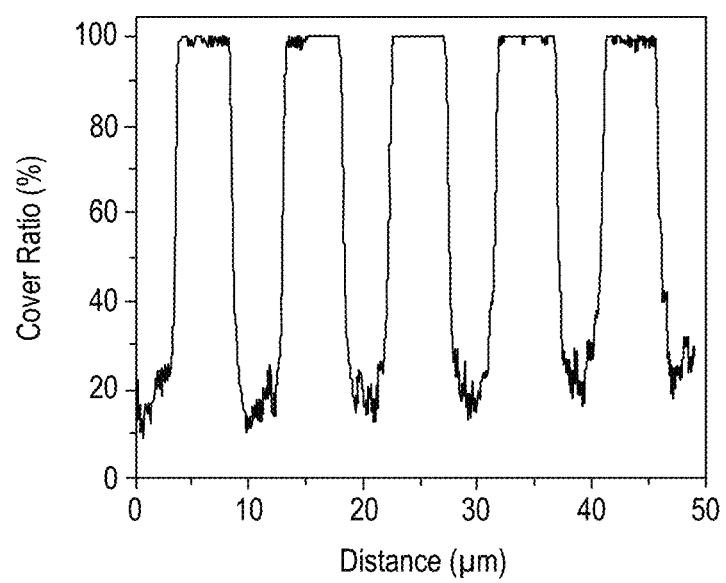

FIG. 7B is a cover ratio profile across the transition-metal dichalcogenide pattern, as extracted from FIG. 7A.

Figure 7C:
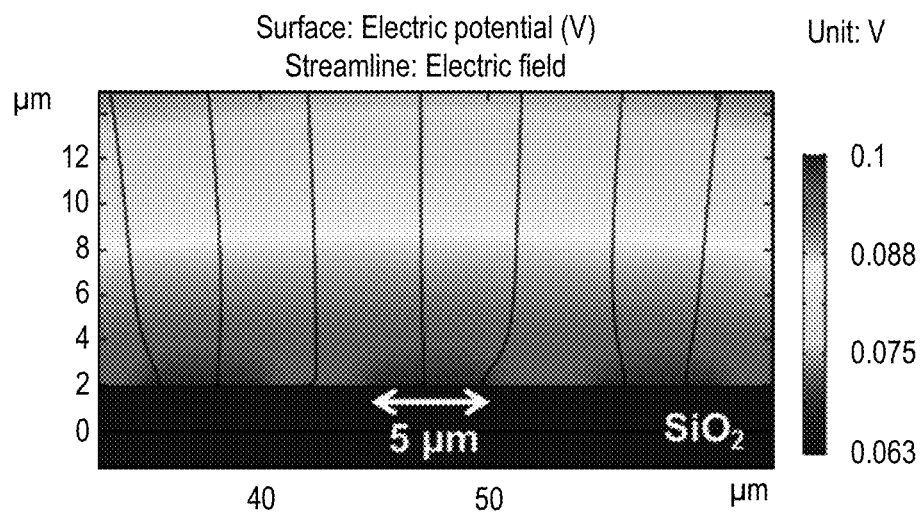

FIG. 7C is a finite element analysis stimulated electric field associated with the corresponding rubbing-induced triboelectric charge pattern.

Figure 7D:
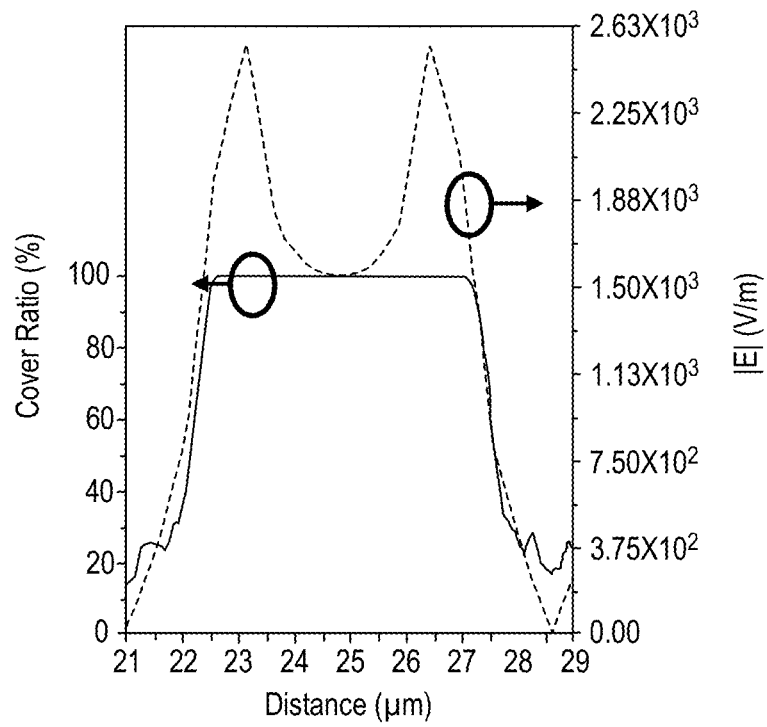
Figure 7E:
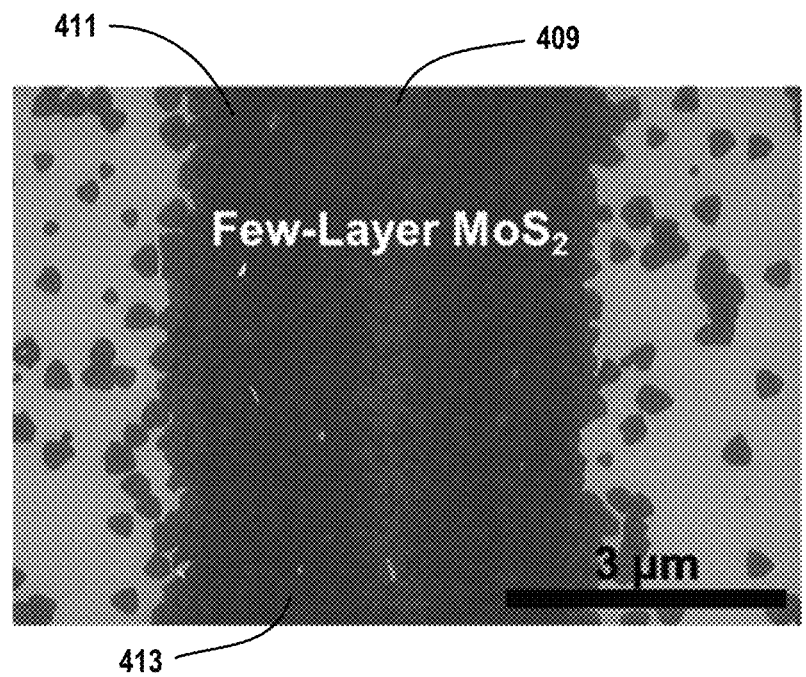

FIG. 7D is a plot of the field magnitude profile from FIG. 7C and the cover ratio profile from FIG. 7A FIG. 7E is a close up image of a single transition-metal dichalcogenide line of FIG. 7B.

Figure 7F:
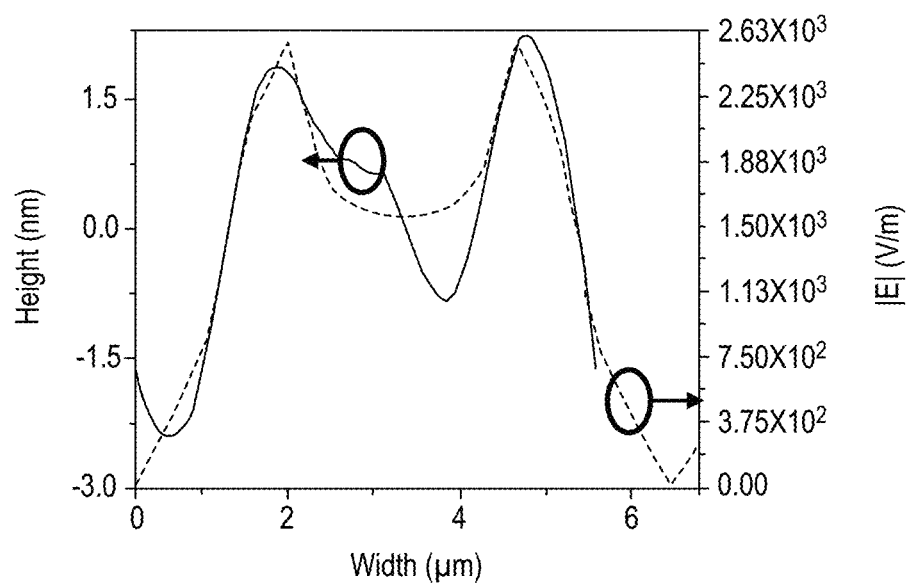

FIG. 7F is a plot of an atomic force microcopy profile of FIG. 7E and the field magnitude profile from FIG. 7C.

Figure 8A:
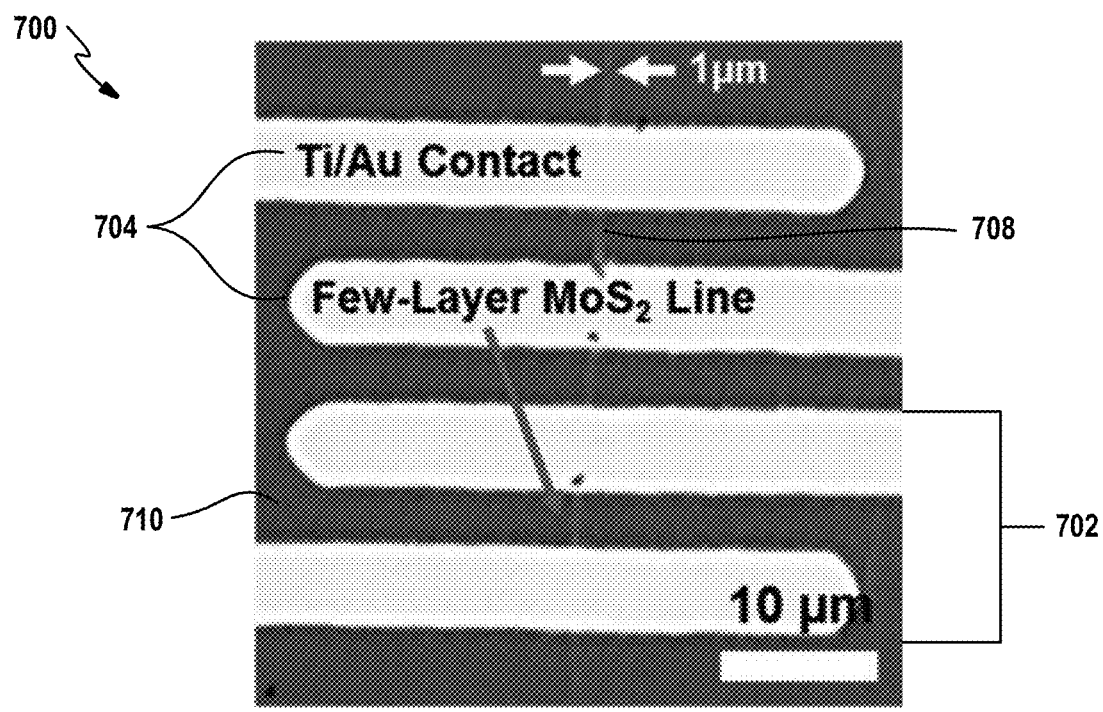

FIG. 8A is an optical micrograph of representative field-effect transistors fabricated on the transition-metal dichalcogenide line.

Figure 8B:
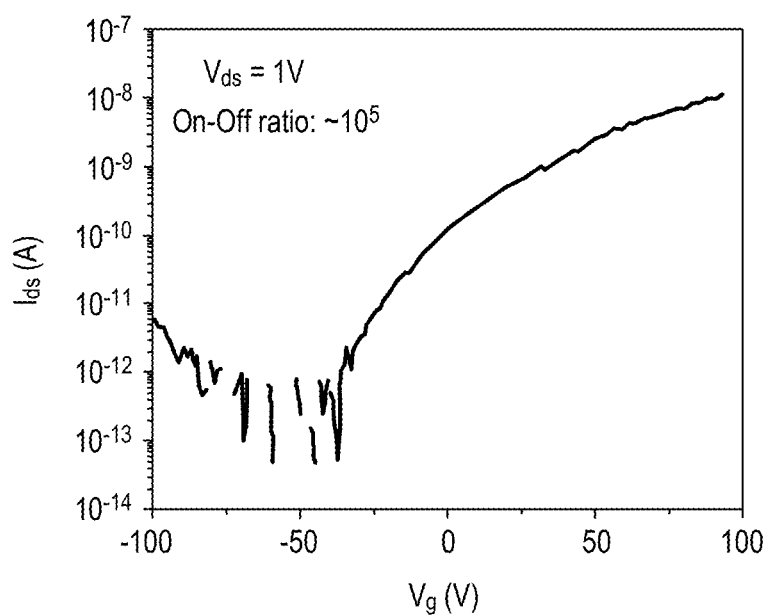

FIG. 8B plots the transfer characteristic curve measured from a representative field-effect transistor.

Figure 8C:
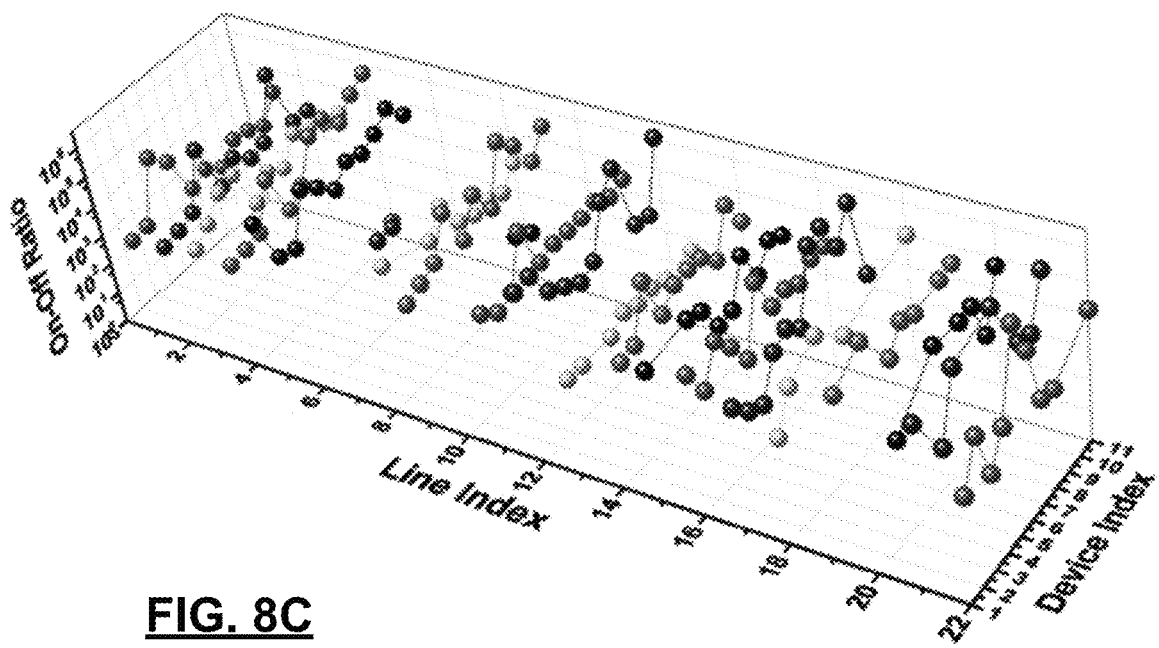

FIG. 8C is a three-dimensional image plot of the on/off ratio data measured from the functional field-effect transistors as a function of the respective line and device indexes.

Figure 8D:
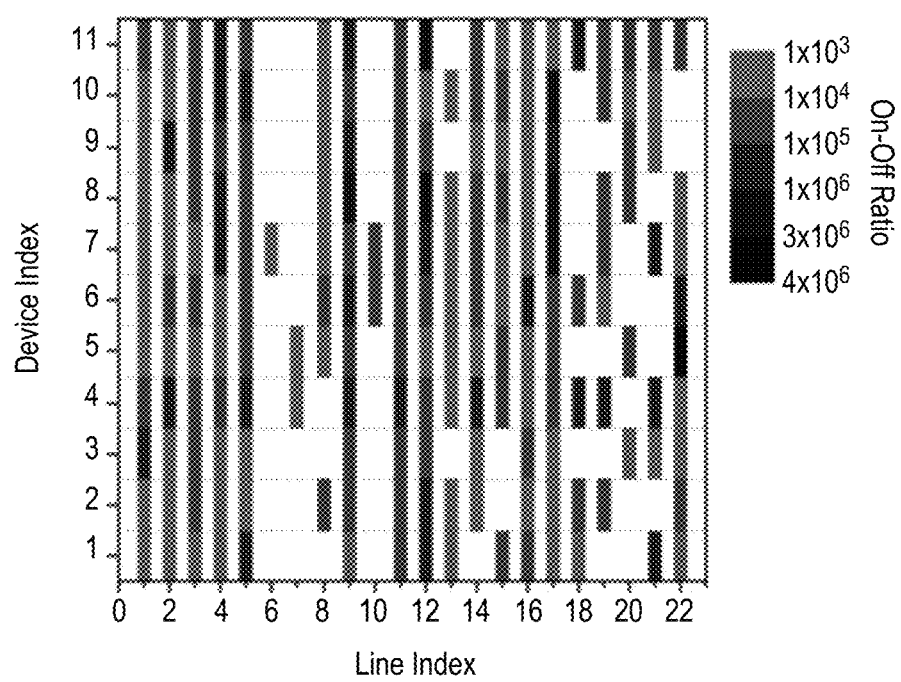

FIG. 8D is a two-dimensional image plot of the on/off ratio data measured from the functional field-effect transistors as a function of the respective line and device indexes.

Figure 8E:
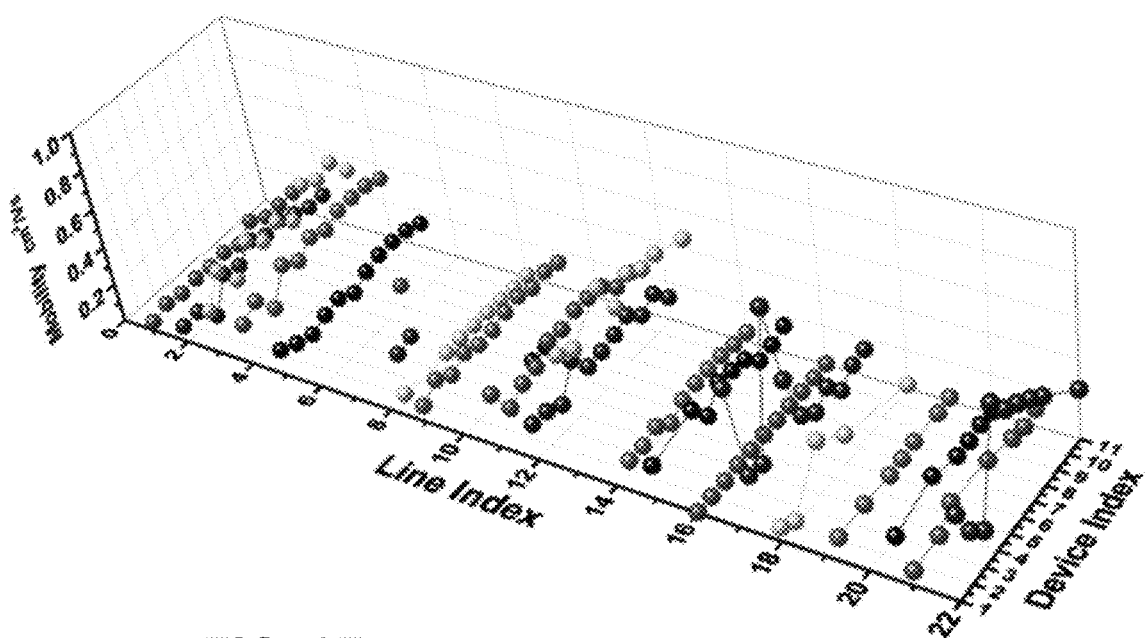

FIG. 8E is a three-dimensional plot of the field-effect mobility data as a function of the respective line and device indexes.

Figure 8F:
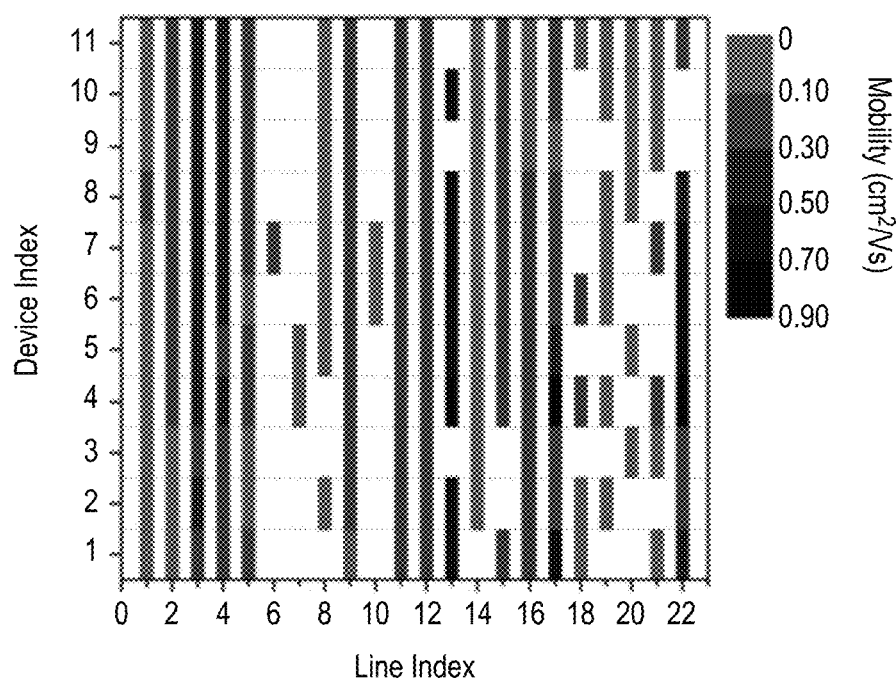

FIG. 8F is a two-dimensional image plot of the field-effect mobility data as a function of the respective line and device indexes.

Figure 9A:
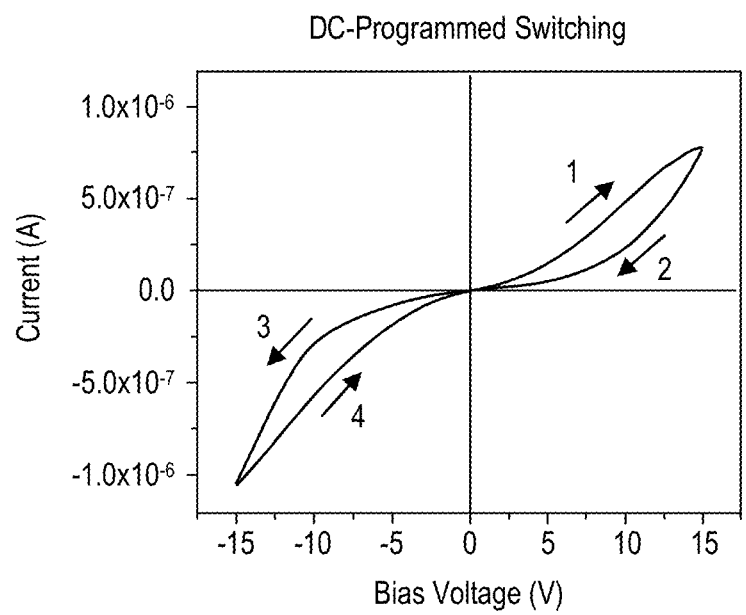

FIG. 9A is a DC-programmed switching characteristic curve measured from a representative memristor.

Figure 9B:
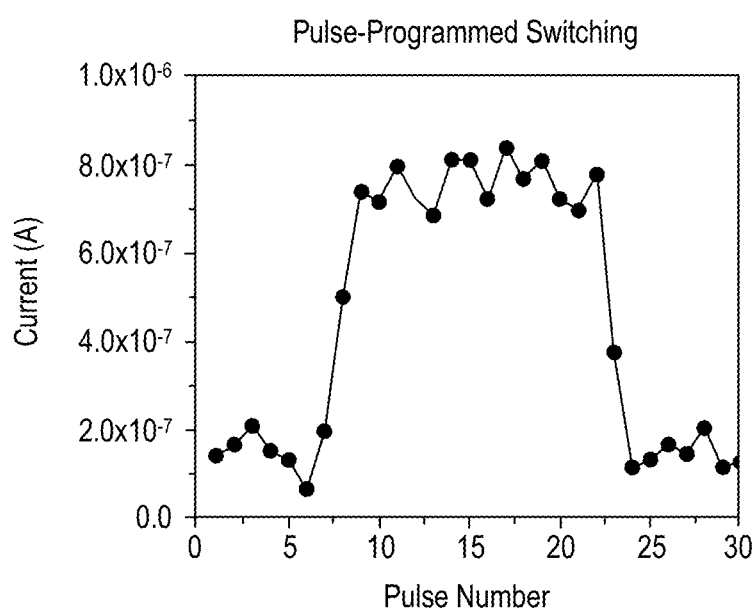

FIG. 9B is a pulse-programmed switching characteristic curve measured from the representative memristor.

Figure 9C:
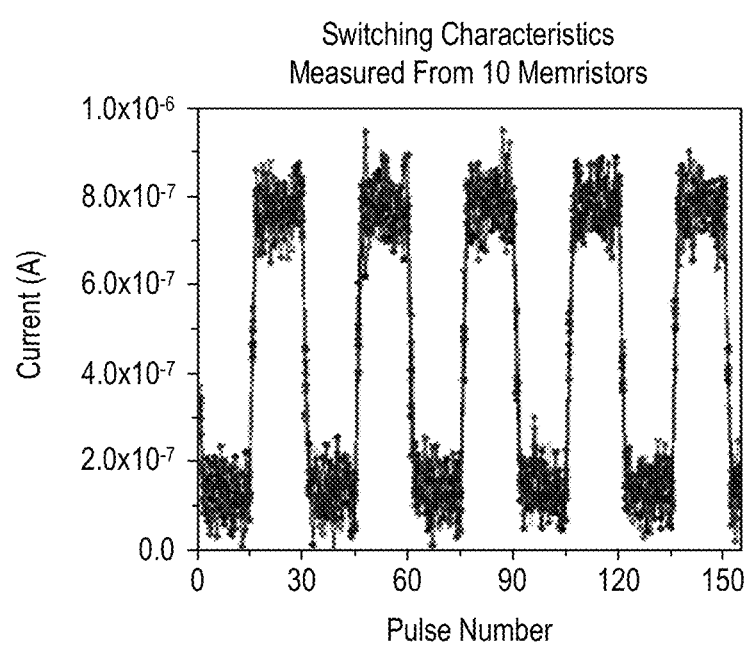

FIG. 9C is a pulse-programmed switching characteristic curve measured from 10 representative memristors that are plotted together to highlight the device-to-device consistency in the switching characteristics.

Corresponding reference numerals indicate corresponding parts throughout the several views of the drawings.

DETAILED DESCRIPTION

Example embodiments will now be described more fully with reference to the accompanying drawings.

The fabrication of two-dimensional layered transition-metal dichalcogenide based devices in a laboratory environment generally comprises mechanically transferring or printing flakes from a bulk ingot to one or more surfaces of a dielectric substrate. In certain instances, the dielectric substrate may be comprised one or more of silicon oxide ($SiO_x$, where $1 \leq x \leq 2$), silicon nitride ($Si_3N_4$), glass quartz, aluminum oxide ($Al_2O_3$), titanium dioxide ($TiO_2$), and other insulating dielectrics. The flakes comprise one or more transition metal dichalcogenides, such as molybdenum disulfide ($MoS_2$), tungsten diselenide ($WSe_2$), tungsten disulfide ($WS_2$), molybdenum diselenide ($MoSe_2$), molybdenum ditelluride ($MoTe_2$), and other dichalcogenides. In some other instances, a film is grown on the substrate using deposition methods, such as chemical vapor deposition ("CVD"), physical vapor deposition ("PVD"), and atomic-layered deposition ("ALD"). The film also comprises the one or more transition metal dichalcogenides.

After disposing the transition-metal dichalcogenide layer onto the substrate (by mechanically transferring flakes or by forming a film), metallic contacts are deposited onto the coated substrate to form the transition-metal dichalcogenide based device. In certain instances the metallic contacts comprise one or more of titanium (Ti), chromium (Cr), gold (Au), tungsten (W), copper (Cu), aluminum (Al), and platinum (Pt). The metallic contacts may be deposited onto the coated substrate using a physical vapor deposition method, such as electron-beam evaporation, ion sputtering deposition, or thermal deposition.

Manufacturing commercially-viable arrays of such two-dimensional layered transition-metal dichalcogenide based devices that have consistent characteristics requires additional resist-based lithography and plasma-based etching processes to pattern as-deposed transition-metal dichalcogenide layers into functional device features. Such processes, however, regularly introduce contaminates that complicate and degrade transport characteristics of the devices. Conventional semiconductor cleaning approaches cannot safely eliminate the contaminates without causing additional chemical and/or physical damage to the thin transition-metal dichalcogenide layers, which generally have weak adhesion with the dielectric substrate and can be easily peeled by bubbling gases during the cleaning process. As such, site-selective growth techniques capable of directly generating patterned transition-metal dichalcogenide layers and other layered-material based device without the use of addition lithography and etching processes is highly desirable.

Figure 1:
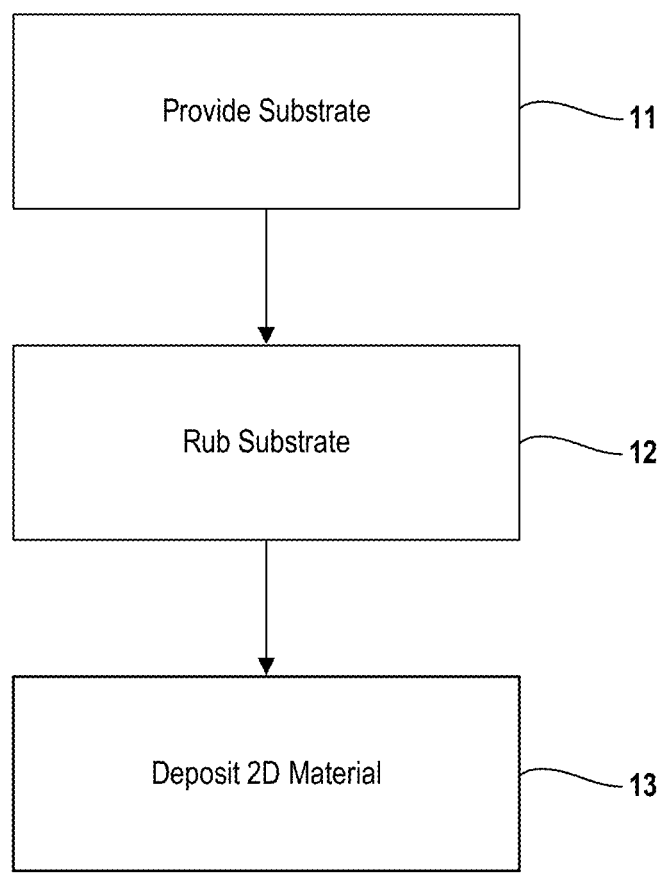
FIG. 1 is a diagram depicting a site-selective growth method for fabricating a semiconductor device.

With reference to FIG. 1, a site-selective growth method is presented for fabricating electronic devices, such as thin-filmed transistors ("TFTs"), memories, memristors, multiplexing biosensors and the like. Fabrication begins with a substrate as indicated at 11. An exposed surface of the substrate is first rubbed at 12 with a patterned template to generate a pattern of surface charge on the exposed surface of the substrate. In an example embodiment, the patterned template is moved in relation to the substrate using a motorized stage driven by a microcontroller, such that the substrate is supported by the motorized stage. The exposed surface of the substrate is preferably rubbed with a contact force that is less than the compressive strength of the substrate (e.g., ~100 mN depending upon the substrate material). It is noted that the triboelectric property of material comprising the substrate differs from the triboelectric property of material comprising the patterned template.

A two-dimensional material is disposed onto the exposed surface of the substrate such that the two-dimensional material adheres to the exposed surface in accordance with the pattern of surface charge. Different types of two-dimensional materials are contemplated, including graphene, transition-metal dichalcogenides, such as molybdenum disulfide ($MoS_2$), tungsten diselenide ($WSe_2$), tungsten disulfide ($WS_2$), molybdenum diselenide ($MoSe_2$), molybdenum ditelluride ($MoTe_2$), and other layered materials (also called "van de Waals solids"). In one embodiment, the two-dimensional material is deposited onto the exposed surface of the substrate using chemical vapor deposition. In other embodiments, the two-dimensional material is deposited onto the exposed surface of the substrate using physical vapor deposition.

Figure 2A:
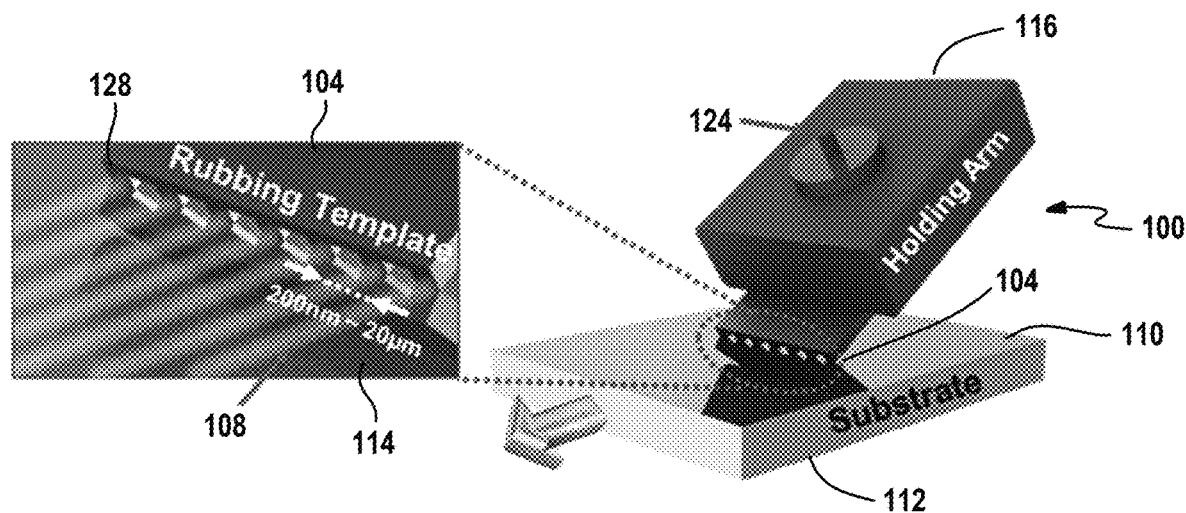
FIGS. 2A-2C are illustrations of an example setup for implementing the site-selective growth method.
Figure 2B:
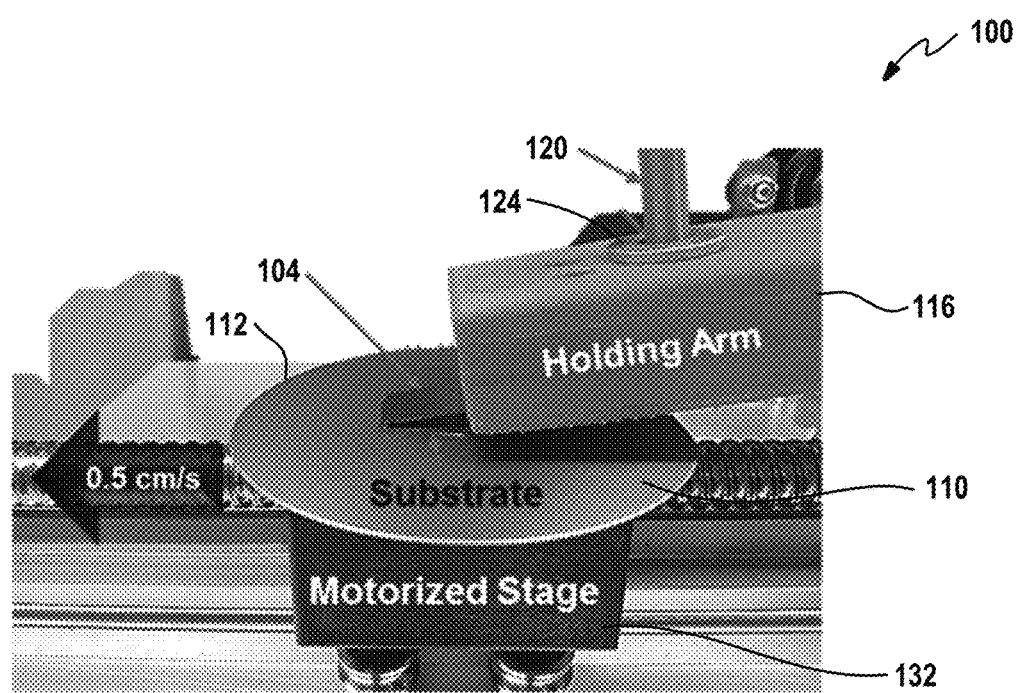
Figure 2C:
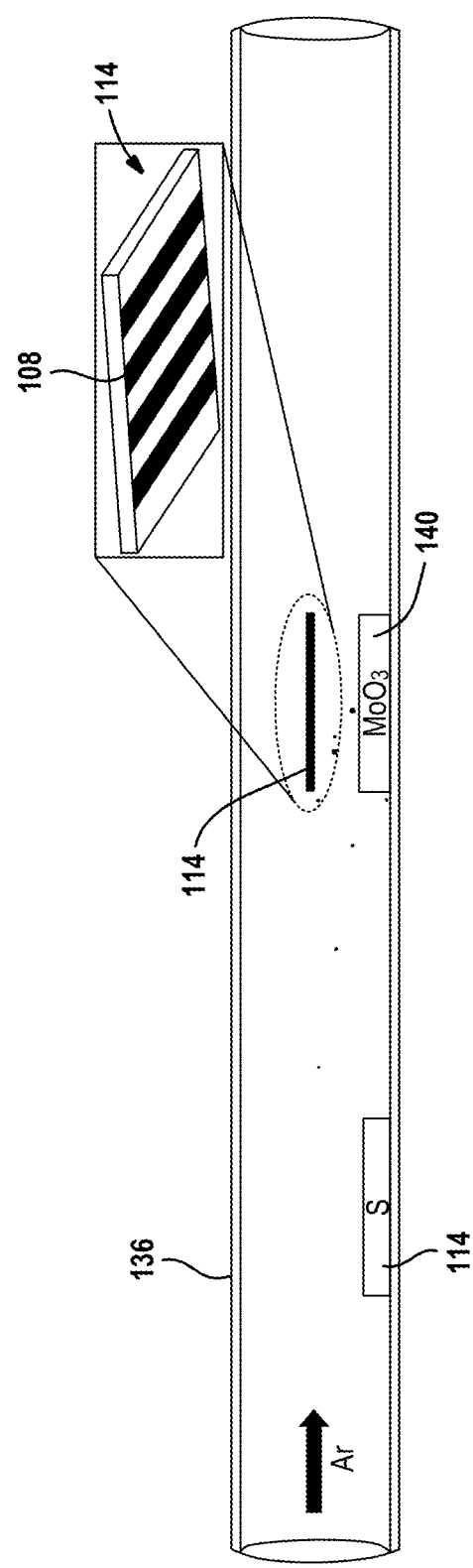

FIGS. 2A-2C further illustrate an example of a motorized rubbing tool 100 for generating a triboelectric charge patterns 108 on a dielectric substrate 112 using a rubbing template 104. In certain instances, the rubbing template 104 may be fabricated by spin-coating a photoresist layer (e.g. SPR 220) onto a substrate and baking the coated substrate. For example, the photoresist-coated substrate may be baked at about 115° C. for about 5 minutes. The baked substrate is then aligned with a photomask bearing line/spacing patterns and exposed to ultraviolet light using, for example, a MA6/BA6 mask aligner. The developed substrate may then be etched using a plasma etcher (e.g., LAM 9400) using etching conditions such as an RF power of about 600 W, a hydrogen bromide (HBr) flowrate of about 100 sccm, and a helium (He) flowrate of about 100 sccm. The developed substrate may also be etched using wet solution etching. The substrate may be etched to have topographic features such as grooves or other patterns having protrusive features. The rubbing substrate may include one or more of silicon oxide ($SiO_x$, where $1 \leq x \leq 2$), silicon nitride ($Si_3N_4$), glass quartz, aluminum oxide ($Al_2O_3$), titanium dioxide ($TiO_2$), and other insulating dielectrics.

As seen in FIG. 2A, the rubbing template 104 has the desired topographic features formed (for example, groves) and is obliquely mounted on a holding arm 116. In certain instances, the holding arm 116 may be formed for polylactic acid ("PLA") plastic and fabricated using a three-dimensional ("3-D") printer. When a mass weight 120 is added to the holding arm 116 via a weight holder 124, an edge 128 of the rubbing template 104 is brought into contact with a first surface 110 of the substrate 112. The contact force between the rubbing template 104 and the substrate 112 can be controlled by adjusting the mass weight 120 added to the holding arm. For example, in certain instances, a contact force of about 100 mN (443.5 MPa) may be applied to the substrate 112.

Referring to FIG. 2B, the substrate 112 is supported by a motorized stage 132 and is moved in respect to the rubbing template 104. In this fashion, the motorized stage 132 controls precisely the translational motion of the substrate 112 in respect to the rubbing template 104. As such, the typographic features at the template edge 128 rub the substrate 112 to form a pattern of surface charge on the substrate 112. In certain instances, the motorized stage 132 may be controlled by a microcontroller (e.g., an ARDUINO™ microcontroller) and the motorized stage may move the substrate 112 at a speed of about 0.5 cm/s during the rubbing process.

When the rubbing template 104 and the substrate 112 are made from materials with different triboelectricity coefficients, the pattern of surface charge is generated within the rubbed regions 108 on the patterned substrate 114. For example, the rubbing template 104 may comprise one or more materials selected from the group consisting of: copper (Cu), silicon (Si), silicon oxide ($SiO_x$, where $1 \leq x \leq 2$), chromium (Cr), titanium (Ti), and combinations thereof. Such rubbing template 104 materials have a triboelectric coefficient (i.e., triboelectric charge affinity coefficient) ranging from about 10 nC/J to about 60 nC/J. The substrate 112 may comprise one or more materials selected from the group consisting of: silicon oxide ($SiO_x$, where $1 \leq x \leq 2$), silicon nitride ($Si_3N_4$), glass quartz, aluminum oxide ($Al_2O_3$), titanium dioxide ($TiO_2$), and combinations thereof. Such substrate 112 materials have a triboelectric coefficient ranging from about −10 n C/J to about 60 nC/J. As seen, the materials comprising the rubbing template 104 and the substrate 112 may be independently selected from the same or similar material groups. Thus, the materials in either group may have overlapping triboelectric coefficient ranges but the selected material pair respectively forming the rubbing template 104 and the substrate 112 will have different triboelectric coefficients.

In certain instances (not shown), the rubbing template 104 may be coated to further aid in the generation of prominent and consistent triboelectric charge patterns on the patterned substrate 114. For example, the coating may comprise one or more materials selected from the group consisting of: copper (Cu), silicon (Si), silicon oxide ($SiO_x$, where $1 \leq x \leq 2$), chromium (Cr), titanium (Ti), gold (Au), silver (Ag), and combinations thereof. The coating may have a thickness of about 5 nm deposited onto the rubbing template 104 using a physical vapor deposition method, such as electron-beam evaporation, thermal evaporation, or ion sputtering deposition.

After the triboelectric charge patterns 108 are formed, the patterned substrate 114 is loaded into a tube 136 for chemical vapor deposition (e.g., thermal chemical vapor deposition, plasma-enhanced chemical vapor deposition, metal oxide chemical vapor deposition), as shown in FIG. 2C, where the transition-metal dichalcogenide layers 140 are grown within the rubbed areas 108. In one example, the chemical vapor deposition process includes placing the transition-metal dichalcogenide precursor material 140 (e.g., $MoO_3$ (99.7%, Sigma Aldrich) and 300 mg of sulfur (99.5%, Sigma Aldrich)) at a center and upstream locations of a quartz tube having an one-inch diameter. The patterned substrate 114 serves as a target substrate and is placed face-down above the precursor material 140. Aragon (Ar) may be used as the carrier gas and the gas flow rate may be set to about 150 sccm. The temperature of the central area of the furnace chamber rises to about 800° C. and is maintained for about 5 minutes during the deposition process, prior to cooling and removal of the transition-metal dichalcogenide pattern.

Figure 3A:
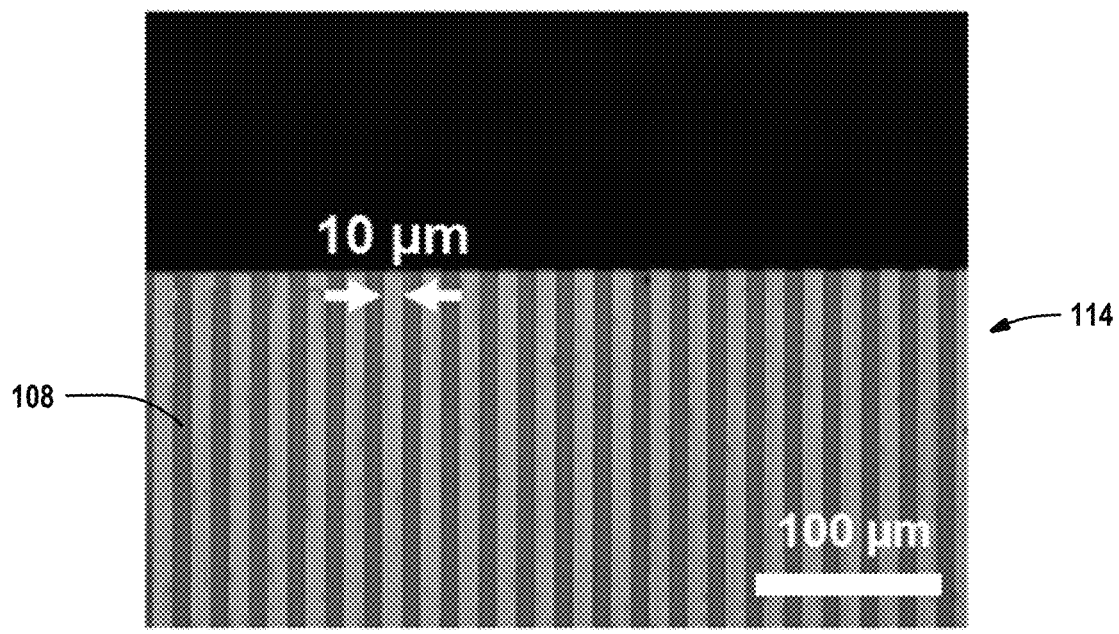
FIG. 3A is an optical micrograph image of the patterned rubbing template.
Figure 3B:
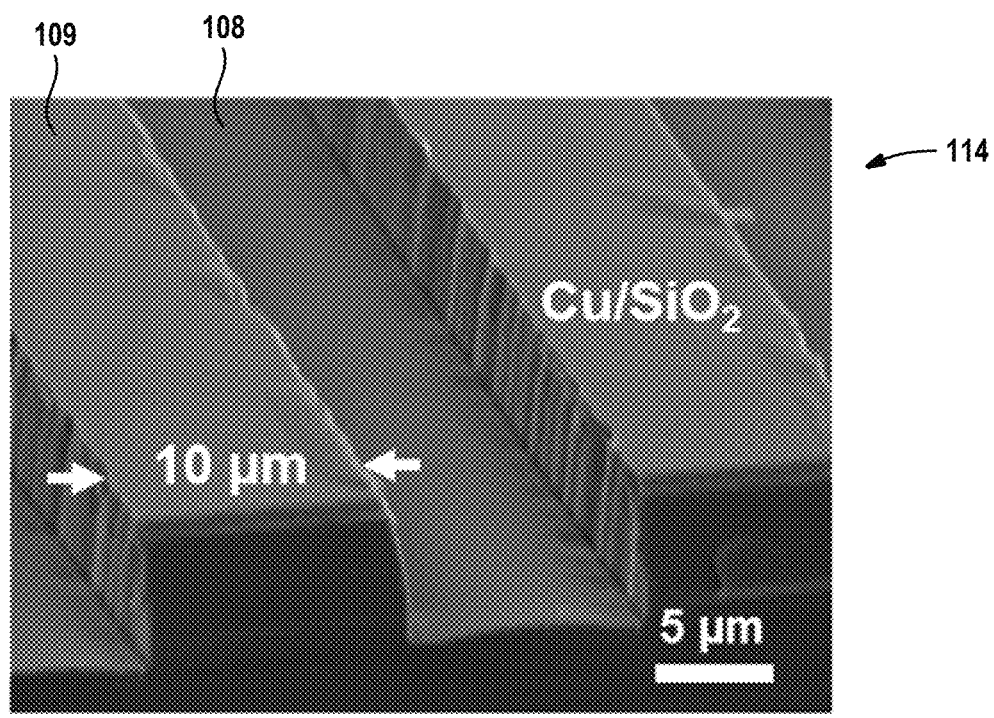
FIG. 3B is a tilted-view scanning electron micrograph image of the patterned rubbing template.
Figure 3C:
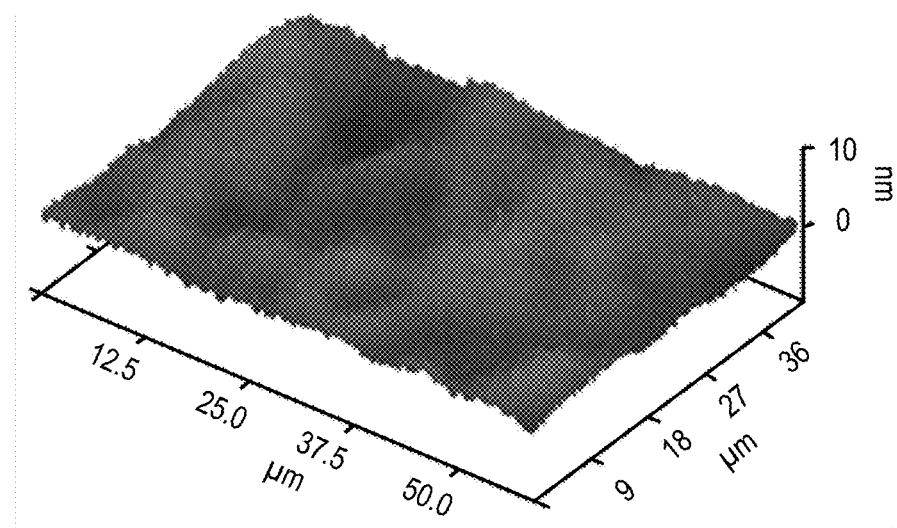
FIG. 3C is a topographic atomic force microscopy image of the substrate rubbed by the rubbing template.
Figure 3D:
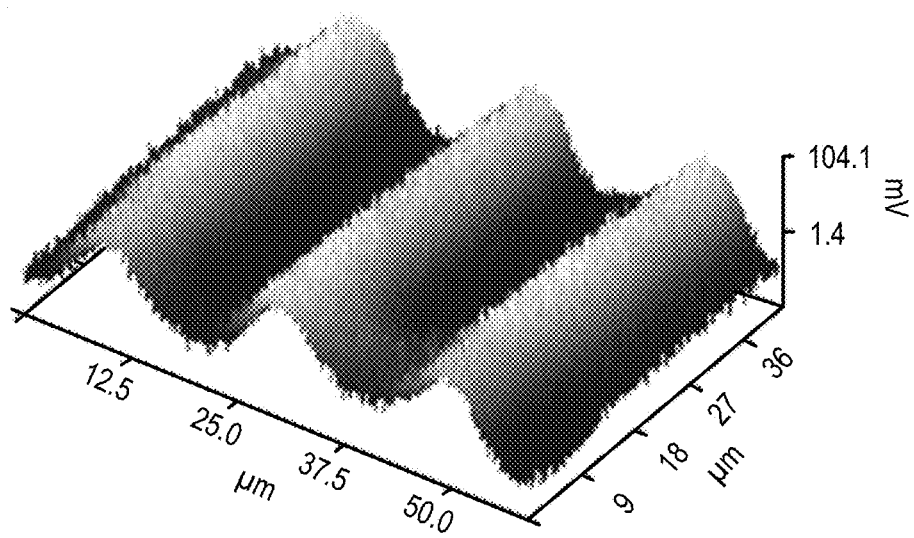
FIG. 3D is a Kelvin probe force microscopy image of the same substrate rubbed by the rubbing template.

FIGS. 3A-3C are images of a patterned substrate 114. FIG. 3A is an optical micrograph ("OM") image of the patterned substrate 114; whereas, FIG. 3B is the tilted-view scanning electron micrograph ("SEM") image of the patterned substrate 114, each showing the rubbed areas or triboelectric charge pattern 108 and the unrubbed areas 109. As shown, the patterned substrate 114 may have a period of about 20 μm, a protrusive line width of about 10 μm, a depth of about 5 μm, and a duty cycle of about 50%. FIG. 3C is a topographic atomic force microscopy ("AFM") image of the patterned substrate 114. As shown, there has been no damage to the surface of the patterned substrate 114. Lastly, FIG. 3D is a Kelvin probe force microscopy image ("KPFM") of the patterned substrate 114. The KPFM image shows a grating-like pattern of electric potential, which is consistent with the line, spacing feature on the rubbing template 104 and attributed to the triboelectric charge induced by rubbing between the rubbing template 104 and the substrate 112. As shown, the peak-to-valley amplitude of potential fluctuation of the patterned substrate is about 100 mV.

The triboelectric charge density, field magnitude, and surface potential ($\varphi$) of the patterned substrate 114 is dependent on the contact force (F) or gauge pressure (P) between the rubbing template 104 and the substrate 112. In FIGS. 4A-4F, a finite element analysis ("FEA") is applied to a Kelvin probe force microscopy images to determine the functional relationship between the surface potential, the contact force, and the contact pressure and allow for precise control of the rubbing-induced site-selective method.

FIGS. 4A-4D provide a series of Kelvin probe force microscopy images (i.e., plots of surface potential as a function of X-Y coordinates) of a patterned substrate (e.g., 114) comprising silica ($SiO_2$) rubbed using a cylindrical copper rod having a diameter of about 0.5 mm, which is illustrative of a copper-coated rubbing template (e.g., 104). More particularly, FIG. 4A is a Kelvin probe force microscopy image of a substrate patterned using a contact force (F) of about 29.4 mN. FIG. 4B is a Kelvin probe force microscopy image of a substrate patterned using a contact force (F) of about 73.5 mN. FIG. 4C is a Kelvin probe force microscopy image of a substrate patterned using a contact force (F) of about 140.2. FIG. 4D is a Kelvin probe force microscopy image of a substrate patterned using a contact force (F) of about 242.3 mN. Surface potentials ((p) are extracted from the Kelvin probe force microscopy images and plotted as a function of the respective contact force (F) in FIG. 4E.

It is difficult to directly measure an effective contact area (A) between the rubbing template (e.g., cylindrical copper rod) and the substrate, as such a finite element analysis is used to evaluate the effective contact area in each situation having a varying contact force. In certain instances, a commercially available finite element analysis package, such as ABAQUS™, may be used. FIG. 4F illustrates the finite element analysis model, in which the cylindrical copper rod 304 is inclined by 45 degrees and its edge 308 makes contact with the first surface 312 of the silica substrate 316. FIG. 4G illustrates a representative simulation of the gauge pressure distribution at the interface 320 between the first surface 312 of the silica substrate 316 and the edge 308 of the cylindrical copper rod 304 under a contact force of 29.4 mN. In certain instances, the simulation is obtained using finite element analysis (FEA) software. The corresponding contact areas (A) and average contact pressure (P) between the substrate 316 and the copper rod 304 are extracted from the results of the finite element analysis model.

In FIG. 4H, the calculated contact areas (A) are plotted with respect to the corresponding contact forces (F). The corresponding average contact pressures (P) for each contact force are calculated from the plot in FIG. 4H, using $$P = \frac{F}{A}.$$

In FIG. 4I, the surface potential values are plotted with respect to the average contact pressures and fitted by an empirical polynomial function, for example, $\varphi = 6 \times 10^{-6} P^3 - 0.0048 P^2 + 1.44 P - 119.9$). The φ-P curve may be used for determining the contact gauge pressure required for generating the triboelectric charge pattern with a given surface potential and also determining if such a rubbing condition induces any damages to the substrate. For example, triboelectric charge patterns with surface potential of 100 mV can result in effective site-selective growth of $MoS_2$ patterns. Based in the φ-P curve of FIG. 4I, the gauge pressure required for performing the rubbing process to generate such charge patterns is about 443.5 MPa. The pressure value is, therefore, about one order of magnitude lower than the tensile strength of silica.

FIGS. 5A-5E illustrate scanning electron micrographs of a series of transition-metal dichalcogenide patterns having different periods and effective linewidths. The effective linewidth of the transition-metal dichalcogenide (e.g., $MoS_2$) lines is defined as the average linewidth of the region in which the grains of the transition-metal dichalcogenide are connected to each other to form a continuous channel line, not including the dispersed transition-metal dichalcogenide grains around the continuous line. For example, in FIG. 5A, the transition-metal dichalcogenide pattern 400 disposed on the patterned substrate 402 has a period 404 of about 20 μm and a linewidth 408 of about 10 μm. In FIG. 5B, the transition-metal dichalcogenide pattern 410 disposed on the patterned substrate 412 has a period 414 of about 10 μm and a linewidth 416 of about 5 μm. In FIG. 5C, the transition-metal dichalcogenide pattern 418 disposed on the patterned substrate 420 has a period 422 of about 2.5 μm and a linewidth 424 of about 450 nm. In FIG. 5D, the transition-metal dichalcogenide pattern 426 disposed on the patterned substrate 428 has a period 430 of about 2 μm and a linewidth 432 of about 290 nm. In FIG. 5E, the transition-metal dichalcogenide pattern 440 disposed on the patterned substrate 442 has a period 444 of about 250 nm and a non-applicable linewidth.

For all transition-metal dichalcogenide patterns, the patterns are consistent with the periods of the corresponding features or patterns of the rubbing template (e.g., 104). As such, the rubbing of the substrate (e.g., 112) to form a patterned substrate (e.g., 114) induces site-selected growth of the transition-metal dichalcogenide patterns on the patterned substrates. To evaluate the morphological characters of the transition-metal dichalcogenide patterns, a specific cover ratio parameter is introduced. The specific cover ratio parameter is defined as the percentage of the local area or the patterned substrate covered by the deposed transition-metal dichalcogenide patterns. As seen in FIGS. 4A-4E, the transition-metal dichalcogenide pattern has a high cover ratio ranging from about 80% to about 100%. For example, in certain instances, a MATLAB™-based imagining tool may be used for processing the scanning electron micrographs and measuring the cover ratio profiles.

Gradual variation of the cover ratio may be seen at the edge regions of the transition-metal dichalcogenide patterns. Such gradual variation of the cover ratio, does not significantly affect the effective linewidths of transition-metal dichalcogenide patterns having linewidths larger than about 2 μm, as seen in FIGS. 5A and 5B. In such instances, the effective linewidths of the transition-metal dichalcogenide patterns are determined by the linewidths of the corresponding features of the rubbing template. However, for transition-metal dichalcogenide patterns having smaller linewidths, as seen in FIGS. 5C-5E, such gradual variation of the cover ratio at the edges of the transition-metal dichalcogenide patterns may result in smaller effective linewidths as compared to those of the corresponding features of the rubbing template. For example, as seen in FIG. 5E, the transition-metal dichalcogenide patterns having a period of about 250 nm and a non-applicable linewidth are non-continuous as a result of the dispersive variation of the cover ratio at the edges of the transition-metal dichalcogenide patterns.

The gradual variation of the cover ratio at the edges of the transition-metal dichalcogenide patterns is attributed to the net effect of (1) the field magnitude distribution within the patterns and (2) the diffusion of nucleated transition-metal dichalcogenide (e.g., MoS$_2$) domains from triboelectric charge pattern areas. To quantitatively correlate the spatial distribution of the rubbing-induced triboelectric field and the distribution of the triboelectric charge pattern cover ratio, a finite element analysis was applied. The finite element analysis stimulates the electric field associated with the triboelectric charge on the surface of the substrate. In certain instances, a COMSOL™ software package may be used to create the finite element analysis stimulation.

The stimulated electric field is compare with the corresponding cover ratio of the triboelectric charge pattern that is measured using the appropriate scanning electron micrographs of FIGS. 5A-5E. For example, FIGS. 6A-6D illustrates the cover ratio analysis for the relatively narrow transition-metal dichalcogenide pattern of FIG. 5D. FIG. 6A shows a binary scanning electron microscope of the transition-metal dichalcogenide pattern of FIG. 5D. For example, in certain instances, the original scanning electron microscope image of the transition-metal dichalcogenide pattern (e.g., FIG. 4D) can be processed into a binary image (e.g., FIG. 6A) using Otsu's algorithm, where the local pixels covered by the transition-metal dichalcogenide 418 are counted. The local pixels are those dark pixels as shown in the binary scanning electron microscope image of FIG. 6A.

The cover ratio profile from across several lines of the transition-metal dichalcogenide pattern 418 is extracted from FIG. 6A and plotted in FIG. 6B. For example, in certain instances, the cover ratio is calculated by measuring on the scanning electron microscope image of FIG. 6A the sample area covered with the transition-metal dichalcogenide and dividing the measured area by the total sample are in the scanning electron microscope image. The cover ratio profile is measured out from a central region of the transition-metal dichalcogenide pattern. FIG. 6B shows that the cover ratio distribution of the transition-metal dichalcogenide pattern 418 across have a sine-like profile with peak values in the range of about 80% to about 92% and valley values corresponding to the patterned substrate 420 ranging from about 6% to about 30%. Similar to the cover ratio of the transition-metal dichalcogenide pattern 418, the valley values are measured from the central regions of the unrubbed portions of the patterned substrate 420.

As shown in FIG. 6C, a finite element analysis is used to stimulate the electric field associated with the triboelectric charge on the surface of the patterned substrate 420. The finite element analysis assumes a uniform charge density within the rubbed. More particularly, the value of the charge is set so that the potential at the central area of the transition-metal dichalcogenide pattern 418 is about 100 mV, which is consistent with the potential measured from Kelvin probe force microscopy ("KPFM") image in FIG. 3D. From FIG. 6C, the field magnitude profile around a single charge line is extracted from the KPFM image and plotted as a dashed line in FIG. 6D. For comparison, the cover ratio profile measured around the transition-metal dichalcogenide lines 417 forming the transition-metal dichalcogenide pattern 418 from FIG. 6A is also plotted as a solid line. As seen in FIG. 6D, the spatial distribution profiles of field magnitude and the cover ratio of the transition-metal dichalcogenide pattern 418 have similar shapes and exhibit a strong correlation to each other. More particularly, the field magnitude in the middle of a particular line 417 of the transition-metal dichalcogenide pattern 418 is about $1.2 \times 10^3$ V/m and the localized cover ratio is about 80%. The field magnitude at the edge 415 of the particular line 417 is about 450 V/m and the localized cover ratio at the edge 415 ranges from about 30% to about 45%.

FIG. 7A shows a binary scanning electron microscope of the transition-metal dichalcogenide pattern of FIG. 5B. The cover ratio profile from across several lines of the transition-metal dichalcogenide pattern 410 is extracted from FIG. 7A and plotted in FIG. 6B. As shown in FIG. 6B, transition-metal dichalcogenide patterns having wider linewidths—for example, line widths that are greater than about 2 μm and preferably greater than about 5 μm—the cover ratio distribution is about 100% of the rubbed areas of the patterned substrate 412. Comparatively, the cover ratio of the unrubbed areas of the patterned substrate 412 is about 20% and is considered negligible. The transition-metal dichalcogenide grains in such areas are attributed to the lateral diffusion of the grains from the rubbed area (see, e.g., FIG. 3B).

FIG. 7C displays an electric field associated with the triboelectric charge calculated using a finite element analysis. The parameters for FIG. 7C are the same as those set forth above with respect to FIG. 6C. From FIG. 7C, the field magnitude profile across a single charge line (i.e., a single 5 μm line) is extracted and plotted as a dashed line in FIG. 7D. For comparison, the cover ratio profile measured around the transition-metal dichalcogenide lines 413 forming the transition-metal dichalcogenide pattern 410 from FIG. 7A is also plotted as a solid line. Different from the field magnitude profile seen in FIG. 6C, the field distribution around the transition-metal dichalcogenide lines 413 exhibits two peaks at the edges 411 of the respective lines 413. The two peaks result in an electric field magnitude over the entire transition-metal dichalcogenide pattern 410 that is greater than about $1.5 \times 10^3$ V/m and a cover ratio of about 100%. FIG. 7D also shows that the triboelectric field magnitude and the cover ratio of the transition-metal dichalcogenide pattern 410 exhibit a strong correlation. As such, the localized triboelectric field magnitude is an important factor affecting the nucleation of the precursor transition-metal dichalcogenides and the subsequent cover ratio.

The transition-metal dichalcogenide lines 413 forming the transition-metal dichalcogenide pattern 410 have different localized thicknesses. For example, FIG. 7E shows a portion of the transition-metal dichalcogenide lines 413 from FIG. 5B. In FIG. 7E, the darkness distribution across the transition-metal dichalcogenide line 413 highlights the differences in thickness across the line 413. More particularly, the edge 411 area of the transition-metal dichalcogenide line 413 appears to be thicker than a central area 409 of the line 413. The solid line in FIG. 7F illustrates an atomic force microscopy height profile curve as acquired across the transition-metal dichalcogenide line 413 and the dash line illustrates the triboelectric field magnitude from FIG. 7C. The atomic force microcopy profile shows that from the center 409 of the transition-metal dichalcogenide line 413 to its edges 411, the thickness of the transition-metal dichalcogenide line 413 ranges from about 1.5 nm or about two transition-metal dichalcogenide layers to about 3 nm or about three transition-metal dichalcogenide layers. As shown in FIG. 7F, the atomic force microcopy profile and the triboelectric field magnitude exhibit a strong correlation. As such, the localized triboelectric field magnitude is again shown to be an important factor to affecting the nucleation of the precursor transition-metal dichalcogenides and the subsequent cover ratio.

In one instance, the large-area uniformity of the patterned transition-metal dichalcogenide devices were evaluated by fabricating field-effect transistor array on the patterned device comprising transition-metal dichalcogenide layers as a plurality of transition-metal dichalcogenide lines. To make the example field-effect transistor array, twenty-two transition-metal dichalcogenide lines were produced on a p+-type silicon substrate coated with thermally grown silica. The silica coating has a thickness of about 300 nm, and the transition-metal dichalcogenide lines have an effective linewidth of about 1 μm. The transition-metal dichalcogenide lines have a comparatively large interline spacing to provide footprint areas for metallic contacts. The interline space is about 200 μm and the metallic contact may comprise tin (Sn), gold (Au), and combinations thereof. After the transition-metal dichalcogenide lines were formed on the substrate, eleven field-effect transistors with a channel length of about 5 μm were fabricated on each transition-metal dichalcogenide line, so that the field-effect transistor array has a total of 242 field-effect transistors, where the silica coated silicon substrate serves as a common back gate for the field-effect transistors of the array.

FIG. 8A shows an optical micrograph of three field-effect transistors 702 fabricated on a transition-metal dichalcogenide line 708 formed on the silica coated silicon substrate 710 also comprising a plurality of metallic contacts 704 deposed thereon. FIG. 8B plots the transfer characteristic curve—that is, the drain-source current ($I_{ds}$) versus the gate voltage ($V_g$)—measured from a representative field-effect transistor 702 of the field-effect transistor array 700 of FIG. 8A. As shown in FIG. 8B, the representative field-effect transistor 702 exhibits a typical n-type transport behavior and its on-off ratio is about $10^5$. For comparison, 184 of the 242 fabricated field-effect transistors are functional devices, providing a fabrication yield of at least 76%.

FIGS. 8C and 8D are plots of the on/off ratio data measured from the 184 functional field-effect transistors as a function of the respective line and device indexes. More particularly, FIG. 8C is a three-dimensional image plot of the on/off ratio data measured from the functional field-effect transistors, and FIG. 8D is a two-dimensional image plot of the on/off ratio data measured from the functional field-effect transistors. FIG. 8D provides a clear view of the location distribution of the functional field-effect transistors within the array 700. s shown in FIGS. 8C and 8D the on-off ratio data measured from the functional field-effect transistors range from about $10^3$ to about $3 \times 10^6$.

FIGS. 8E and 8F are plots of the field-effect mobility data extracted from the transfer characteristics as shown in FIG. 8B as a function of the respective line and device indexes. FIG. 8E is a three-dimensional plot of the field-effect mobility data, and FIG. 8F is a two-dimensional image plot of the field-effect mobility data. In certain instances, the field-effect mobility of the functional field-effect transistors are extracted using the following equation:

$$\mu = \frac{1}{C_{ox}\frac{W}{L}V_{ds}}\left(\frac{dI_{ds}}{dV_g}\right) \quad C_{ox} = \frac{\varepsilon_0 \varepsilon_r}{d}$$

where $\varepsilon_o$ is the vacuum permittivity, $\varepsilon_r$ is 3.9 (which is the relative permittivity of the silica dielectric layer), $C_{ox}$ is the gate capacitance, and $$\frac{W}{L}$$

is the width/length ratio of the channel length of the field-effect transistors 702. The $$\left(\frac{dI_{ds}}{dV_g}\right)$$

value is obtained by linearly fitting the linear region of the curve in FIG. 8B. As shown in FIGS. 8E and 8F the mobility values of the functional field-effect transistors range from about 0.1 cm$^2$/(Vs) to about 1 cm$^2$/(Vs), with a mean value of 0.18±0.17 cm$^2$/(Vs). The comparatively low mobility values are attributed to the relatively small average grain size within the respective transition-metal dichalcogenide lines. More particularly, during the site-selective growth process, the nucleation sites are localized within the target growth areas, the rubbed areas (e.g., FIG. 3B).

Further, as shown in FIGS. 8C-8F, the on/off ratio and mobility data measured from a field-effect transistors formed on a single transition-metal dichalcogenide line (i.e., field-effect transistors with the same line index) exhibit smaller variances as compared to those measured from field-effect transistors formed on different transition-metal dichalcogenide lines (i.e., field-effect transistors with different line indexes). The larger variance between the transition-metal dichalcogenide lines is attributed to the variances in the morphological parameters among the different transition-metal dichalcogenide lines. Such variances may be reduced by optimizing the large-area distribution of rubbing stresses during the etching or rubbing process.

In one instance, the patterned transition-metal dichalcogenide devices were evaluated by fabricating a memristor array having the same structure that analyzed in FIGS. 8A-8F. FIG. 9A shows the switching characteristics measured from a representative memristor of the array. More particularly, FIG. 9A shows the DC-switching characteristic curve of hysteretic I-V curve measured from the representative memristor of the array. As illustrated in FIG. 9A, the representative memristor exhibits a low threshold field magnitude for initiating memristive switching. The threshold field magnitude is about $10^4$ V/cm, which is about two orders magnitude lower than that of conventional memristors based on transition-metal oxides.

FIG. 9B plots the pulse-programmed switching characteristic curve—the current under a fixed voltage of 1 V versus the number of applied pulses—measured from the representative memristor. For example, the pulse-programmed switching cycle may have a set process of 10 −30V with a 5 μs pulse and a reset process of 10 +30 V with a 5 μs pulse. During such a pulse-programmed switching cycle, the memristor current (measured under the 1 V bias) gradually varies from about 100 nA to about 800 nA, indicating a switching ratio of about 8. Such prominent memristive switching characteristics are attributed to the high concentration of movable vacancies in the transition-metal dichalcogenide line. The movable vacancies in the transition-metal dichalcogenide line may dynamically modify the Schotty battier at the interface between the transition-metal dichalcogenide line and the memristor channel, and therefore, modulate the conductance states of the memristors.

FIG. 9C plots the pulse-programmed switching characteristic curves measured from ten memristors in the same array. As shown in FIG. 9C, the representative memristors exhibit a high device-to-device consistency in memristive switching characteristics, which would be beneficial for neural network devices for neuromorphic computing application. For example, in certain instances, the standard deviation in the set and reset processes may be about 3%. FIG. 9C also illustrates high uniformity in the concentrations of movable vacancies among the transition-metal lines.

A rubbing-induced site-selective growth ("RISS") method is provided that can enable scalable fabrication of few-layer transition-metal dichalcogenide (e.g., $MoS_2$) device patterns without the need of additional patterning processes, such as conventional resist-based lithography and/or plasma-based etching processes, is provided. In the RISS method, triboelectric charge patterns are generated on a target dielectric substrate (e.g., silicon-based substrate) using a template-based rubbing process. The triboelectric charge patterns function as highly preferential nucleation sites for growth (for example, via chemical vapor deposition) of transition-metal dichalcogenide structures. The above detailed microscopy characterization in combination with the finite-element analysis simulation illustrate that the morphologies of the RISS-produced transition-metal dichalcogenide structures are correlated with the field magnitude distribution within the rubbing-generated triboelectric charge patterns. RISS-produced transition-metal dichalcogenide structures used to fabricate arrays of field-effect transistors and memristors exhibit a yield of working devices of at least 76% and good device-to-device consistency. Specifically, the field-effect transistors exhibit on/off rations ranging from about $10^3$ to about $3 \times 10^6$ and exhibit an average field-effect mobility of $0.18 \pm 0.17$ $cm^2/(Vs)$, The memristors exhibit a large switching ratio of about 8 and a low threshold field magnitude of about $10^4$ V/cm for initiating memristive switching. The RISS method provides a cost-efficient scalable nonmanufacturing technique capable of producing commercially-viable device patterns based on various layered materials.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A site-selective growth method for fabricating a functional device, comprising:
    providing a substrate;
    rubbing an exposed surface of the substrate with a patterned template to generate a pattern of surface charge on the exposed surface of the substrate, where triboelectric property of material comprising the substrate differs from the triboelectric property of material comprising the patterned template; and
    selectively depositing a two-dimensional material onto the exposed surface of the substrate such that the two-dimensional material adheres to the exposed surface in accordance with the pattern of surface charge.

2. The method of claim 1 wherein the two-dimensional material is selected from a group consisting of graphene and transition-metal dichalcogenides.

3. The method of claim 1 further comprises rubbing an exposed surface of the substrate with a contact force of about 100 mN.

4. The method of claim 1 further comprises rubbing an exposed surface of the substrate with a contact force or stress less than compressive strength of the material comprising the substrate.

5. The method of claim 1 further comprises selectively depositing a two-dimensional material onto the exposed surface of the substrate using chemical vapor deposition.

6. The method of claim 1 further comprises selectively depositing a two-dimensional material onto the exposed surface of the substrate using physical vapor deposition.

7. The method of claim 1 wherein an exterior surface of the patterned template contacting the substrate is copper and the substrate is comprised of a material selected from a group consisting of: silicon oxide, silicon nitride, aluminum oxide, titanium dioxide, and combinations thereof.

8. The method of claim 1 wherein rubbing an exposed surface of the substrate further comprises moving the patterned template in relation to the substrate using a motorized stage driven by a microcontroller.

9. The method of claim 1 further comprises quantitatively determining and modulating the rubbing-induced charge density through adjusting the applied contact force or stress.

10. A site-selective growth method for fabricating a functional device, comprising:
providing a substrate;
contacting an exposed surface of the substrate with a patterned template and moving the patterned template in relation to the substrate to generate a pattern of surface charge on the exposed surface of the substrate, where triboelectric property of material comprising the substrate differs from the triboelectric property of material comprising the patterned template; and
selectively depositing a transition-metal dichalcogenide onto the exposed surface of the substrate such that the transition-metal dichalcogenides adheres to the exposed surface in accordance with the pattern of surface charge.

11. The method of claim 10 further comprises moving the patterned template in relation to the substrate using a motorized stage driven by a microcontroller.

12. The method of claim 10 wherein the exposed surface of the substrate is contacted by the patterned template with a contact force of about 100 mN.

13. The method of claim 10 wherein the exposed surface of the substrate is contacted by the patterned template with a contact force less than compressive strength of the substrate.

14. The method of claim 10 further comprises selectively depositing a two-dimensional material onto the exposed surface of the substrate using chemical vapor deposition.

15. The method of claim 10 wherein the substrate is comprised of silicon oxide and the transition-metal dichalcogenide is molybdenum disulfide.

16. The method of claim 10 further comprises quantitatively determining and modulating the rubbing-induced charge density through adjusting the applied contact force or stress.

* * * * *